United States Patent
Downey et al.

(10) Patent No.: US 12,375,097 B2
(45) Date of Patent: Jul. 29, 2025

(54) CONFIGURABLE DAC CHANNELS

(71) Applicant: Analog Devices International Unlimited Company, Limerick (IE)

(72) Inventors: Fergus John Downey, Oranmore (IE); Christian Steffen Birk, Bandon (IE); Dennis A. Dempsey, Newport (IE); Ken Bryan Fulgosino Fabay, Rizal (PH)

(73) Assignee: Analog Devices International Unlimited Company, Limerick (IE)

( * ) Notice: Subject to any disclaimer, the term of this patent is extended or adjusted under 35 U.S.C. 154(b) by 243 days.

(21) Appl. No.: 18/032,043

(22) PCT Filed: Oct. 29, 2021

(86) PCT No.: PCT/EP2021/080147
§ 371 (c)(1),
(2) Date: Apr. 14, 2023

(87) PCT Pub. No.: WO2022/090477
PCT Pub. Date: May 5, 2022

(65) Prior Publication Data
US 2023/0396265 A1 Dec. 7, 2023

Related U.S. Application Data

(60) Provisional application No. 63/214,652, filed on Jun. 24, 2021, provisional application No. 63/108,151, filed on Oct. 30, 2020.

(51) Int. Cl.
*H03M 1/74* (2006.01)
*H03M 1/00* (2006.01)
*H03M 1/66* (2006.01)

(52) U.S. Cl.
CPC .............. *H03M 1/74* (2013.01); *H03M 1/004* (2013.01); *H03M 1/662* (2013.01); *H03M 1/66* (2013.01)

(58) Field of Classification Search
CPC ........ H03M 1/74; H03M 1/662; H03M 1/004; H03M 1/66
See application file for complete search history.

(56) References Cited

U.S. PATENT DOCUMENTS

| | | |
|---|---|---|
| 5,184,129 A | 2/1993 | Fung et al. |
| 5,519,310 A | 5/1996 | Bartlett |

(Continued)

FOREIGN PATENT DOCUMENTS

| | | |
|---|---|---|
| CN | 202257335 U | 5/2012 |
| CN | 116438745 | 7/2023 |
| WO | 2022090475 | 5/2022 |

OTHER PUBLICATIONS

Huijsing, Johan, "Chapter 5: Output Stages", Operational Amplifiers: Theory and Design, 3rd Ed., Springer Cham, (2017), 105-155.

(Continued)

*Primary Examiner* — Khai M Nguyen
(74) *Attorney, Agent, or Firm* — Schwegman Lundberg & Woessner, P.A.

(57) ABSTRACT

The present disclosure relates to an integrated circuit with at least a first channel and a second channel. Each channel includes at least a DAC. The integrated circuit also includes a number of circuit elements interconnected between the channels. The circuit elements can be changed between a short circuit state and an open circuit state. Normally, each channel will operate independently of one another, using only the circuit components in its respective channel. However, the circuit elements are arranged to allow a user to combine part of the second channel with the first channel to improve the functionality and performance of the first chan- (Continued)

nel. In particular, a state of the circuit elements can be chosen to combine components of the second channel with the first channel. For example, components (e.g. a sub-stage) of the second channel can be connected in parallel with corresponding components (e.g. a corresponding sub-stage) of the first channel. This may reduce the number of available channels, since the second channel can no longer be used as an independent channel. However, the performance of the first channel is enhanced. The presence of the circuit elements allow an end user to decide whether to sacrifice channel count for performance enhancements. For example, the user can provide user input to the integrated circuit to select how the channels are interconnected. Moreover, the integrated circuit does not use additional redundant circuitry to improve the first channel, and rather takes components from the second channel. As such, the integrated circuit can have a reduced size.

20 Claims, 22 Drawing Sheets

(56) References Cited

U.S. PATENT DOCUMENTS

| | | | |
|---|---|---|---|
| 5,764,174 A | 6/1998 | Dempsey et al. | |
| 6,806,771 B1 | 10/2004 | Hildebrant et al. | |
| 7,336,706 B2 | 2/2008 | Krafft et al. | |
| 7,403,041 B2 | 7/2008 | Bajdechi et al. | |
| 7,728,749 B2 | 6/2010 | Sahu | |
| 7,756,677 B1 | 7/2010 | Li | |
| 7,899,099 B2 | 3/2011 | Bergmann et al. | |
| 8,089,383 B2 | 1/2012 | Williams et al. | |
| 8,089,384 B1 | 1/2012 | Williams et al. | |
| 8,487,859 B2 * | 7/2013 | Kim | G09G 3/3688 345/100 |
| 8,878,709 B2 * | 11/2014 | Hyodo | G09G 3/3688 341/144 |
| 9,203,350 B2 | 12/2015 | Dempsey et al. | |
| 9,354,644 B2 | 5/2016 | Sharma et al. | |
| 9,917,557 B1 | 3/2018 | Zhu et al. | |
| 9,929,703 B1 | 3/2018 | Zhao et al. | |
| 10,175,193 B2 | 1/2019 | Chandrasekhar et al. | |
| 10,181,853 B2 | 1/2019 | Slattery et al. | |
| 10,608,662 B2 | 3/2020 | Wong et al. | |
| 10,700,699 B1 | 6/2020 | Briaire | |
| 10,965,251 B1 | 3/2021 | Yeh et al. | |
| 11,398,829 B1 | 7/2022 | Wang et al. | |
| 2007/0200622 A1 | 8/2007 | Filoramo et al. | |
| 2014/0084970 A1 | 3/2014 | Van Der Goes et al. | |
| 2018/0323760 A1 | 11/2018 | Wadekar et al. | |
| 2020/0127610 A1 | 4/2020 | Kusuda et al. | |

OTHER PUBLICATIONS

"AD420: Serial Input 16-Bit 4 mA-20 mA, 0 mA-20 mA DAC", Analog Devices, (2015), 16 pgs.

"AD5522: Quad Parametric Measurement Unit with Integrated 16-Bit Level Setting DACs", Analog Devices, (2018), 64 pgs.

"AD5560: 1.2 A Programmable Device Power Supply with Integrated 16-Bit Level Setting DACs", Analog Devices, (2008), 66 pgs.

"AD5672R/AD5676R: Octal, 12-/16-Bit nanoDAC+ with 2 ppm/° C. Reference, SPI Interface", Analog Devices, (2014), 36 pgs.

"AD5770R: 6-Channel, 14-Bit, Current Output DAC with On-Chip Reference, SPI Interface", Analog Devices, (2019), 61 pgs.

"Application Report—AN-1515 A Comprehensive Study of the Howland Current Pump", Texas Instruments, (2013), 17 pgs.

"International Application Serial No. PCT/EP2021/080144, International Search Report mailed Feb. 24, 2022", 5 pgs.

"International Application Serial No. PCT/EP2021/080144, Written Opinion mailed Feb. 24, 2022", 9 pgs.

"International Application Serial No. PCT/EP2021/080147, International Search Report mailed Feb. 24, 2022", 9 pgs.

"International Application Serial No. PCT/EP2021/080147, Written Opinion mailed Feb. 24, 2022", 9 pgs.

"Quad-Channel Industrial Voltage and Current Output Driver Reference Design (EMC/EMI Tested)", Texas Instruments, (2018), 24 pgs.

Baker, R. Jacob, "CMOS Circuit Design, Layout, and Simulation", IEEE Series on Microelectronic Systems, Wiley, (2010), 1214.

Hastings, Alan, "The Art of Analog Layout", 2nd Ed., Pearson, (2005), 662 pgs.

Hogervorst, Ron, et al., "A Compact Power-Efficient 3 V CMOS Rail-to-Rail Input/Output Operational Amplifier for VLSI Cell Libraries", IEEE Journal of Solid-State Circuits, vol. 29, No. 12, (Dec. 1994), 9 pgs.

Monticelli, D. M, "A quad CMOS single-supply op amp with rail-to-rail output swing", IEEE Journal of Solid-State Circuits, 21(6), (1986), 1026-1034.

Schoenwetter, Howard K, "A High-Speed Low-Noise 18-Bit Digital-to-Analog Converter", IEEE Transactions on Instrumentation and Measurement, 27(4), (Dec. 1978), 413-417.

Sheingold, D. H, "Impedance and Admittance Transformations using Operational Amplifiers", The Lightning Empiricist, 12(1), (1964), 2 pgs.

Song, Young-Hoon, et al., "A 6-Gbit/s Hybrid Voltage-Mode Transmitter With Current-Mode Equalization in 90-nm CMOS", IEEE Transactions on Circuits and Systems—II: Express Briefs, 59(8), (Aug. 2012), 491-495.

Wells, Colin, et al., "Combined Voltage and Current Output with the DACx760", Texas Instruments Application Report SBAA199, (Jul. 2014), 20 pgs.

"U.S. Appl. No. 18/032,036, Non Final Office Action mailed Feb. 21, 25", 12 pgs.

* cited by examiner

CONFIGURABLE DAC CHANNELS

CLAIM OF PRIORITY

This application is a U.S. National Stage of PCT Application No. PCT/2021/080147, filed Oct. 29, 2021, and published as WO 2022/090477 A1 on May 5, 2022, which claims priority to U.S. Provisional Application No. 63/108,151 filed on Oct. 30, 2020, and U.S. Provisional Application No. 63/214,652, filed Jun. 24, 2021, which are hereby incorporated by reference herein in their entirety.

TECHNICAL FIELD

The present disclosure relates to an integrated circuit comprising a plurality of configurable digital-to-analog converter (DAC) channels.

BACKGROUND

Integrated circuits may comprise a plurality of digital-to-analog converter (DAC) channels that convert digital signals to analog signals. Each channel may output the analog signals to respective output terminals (e.g. pins, leads or bumps) on the integrated circuit chip. The analog signals may be, for example, voltage signals.

Users of such integrated circuits are increasingly demanding improved performance from the DAC channels. However, different users often prioritise improvements in different performance characteristics. Performance characteristics of interest to users can include characteristics such as: channel output impedance, voltage headroom, integral and differential non-linearity, voltage offset, noise, and power consumption of the chip.

In order to meet the varying requirements of users, integrated circuits with DAC channels can include a large amount of additional circuitry on-chip. However, much of the additional circuitry is unused by the user and therefore redundant, since the user may only use few components of the additional circuitry that aligns with their specific performance needs. This means that a significant amount of chip area is occupied with redundant and unused circuitry.

SUMMARY

The present disclosure relates to an integrated circuit with at least a first channel and a second channel. Each channel includes at least a DAC. The integrated circuit also includes a number of circuit elements interconnected between the channels. The circuit elements can be changed between a short circuit state and an open circuit state. Normally, each channel will operate independently of one another, using only the circuit components in its respective channel. However, the circuit elements are arranged to allow a user to combine part of the second channel with the first channel to improve the functionality and performance of the first channel. In particular, a state of the circuit elements can be chosen to combine components of the second channel with the first channel. For example, components (e.g. a sub-stage) of the second channel can be connected in parallel with corresponding components (e.g. a corresponding sub-stage) of the first channel. This may reduce the number of available channels, since the second channel can no longer be used as an independent channel. However, the performance of the first channel is enhanced. The presence of the circuit elements allow an end user to decide whether to sacrifice channel count for performance enhancements. For example, the user can provide user input (e.g. a control signal) to the integrated circuit to select how the channels are interconnected. Moreover, the integrated circuit does not use additional redundant circuitry to improve the first channel, and rather takes components from the second channel. As such, the integrated circuit can have a reduced size.

According to a first aspect of the present disclosure, there is provided an integrated circuit comprising: a plurality of digital-to-analog converter (DAC) channels including a first channel and a second channel. Each channel comprises an input for receiving a digital signal, an output for outputting an analog signal, and a plurality of sub-stages in between the input and the output. The integrated circuit further comprises circuitry configured to enable at least a first sub-stage of the second channel to be operated in parallel with a corresponding first sub-stage of the first channel.

According to a second aspect of the present disclosure, there is provided a method comprising: providing the integrated circuit of the first aspect, receiving a control signal indicative of whether the first sub-stages are to be operated in parallel, and short-circuiting inputs or outputs of the first sub-stages if they are to be operated in parallel.

According to a third aspect of the present disclosure, there is provided an integrated circuit comprising a plurality of a digital-to-analog converters (DAC) including a first DAC and a second DAC. Each DAC is configured to convert a digital input into an analog signal, and each DAC includes a plurality of sub-stages. The integrated circuit further comprises circuitry configured to enable at least a first sub-stage of the second DAC to be operated in parallel with a corresponding first sub-stage of the first DAC.

BRIEF DESCRIPTION OF THE DRAWINGS

Examples of the present disclosure are now described with reference to the accompanying drawings, in which.

DETAILED DESCRIPTION

Configurable DAC Channels

Figure 1:
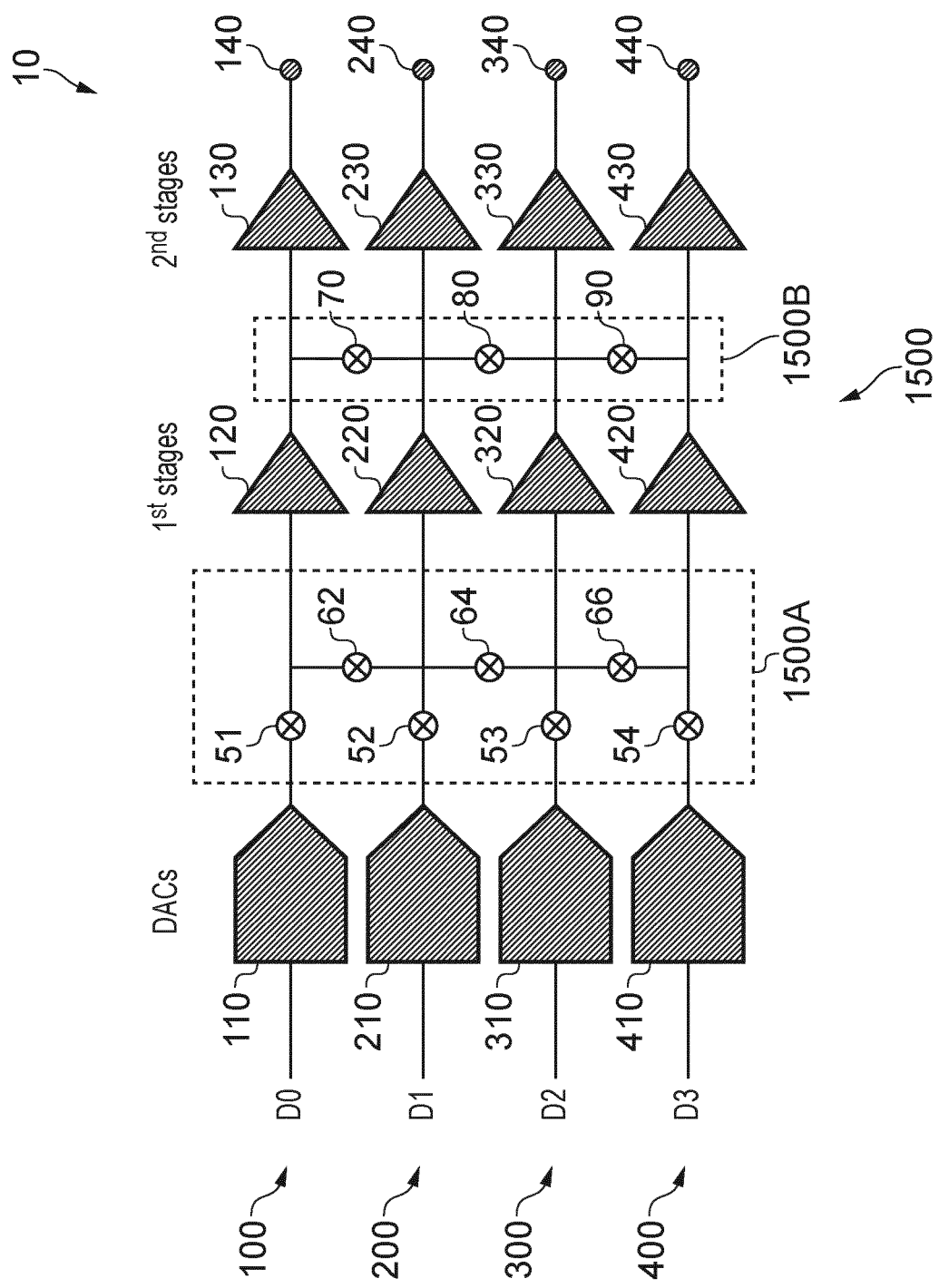
FIG. 1 shows an integrated circuit comprising a plurality of DAC channels according to an example of the present disclosure.

An integrated circuit comprising a plurality of configurable DAC channels is described. Each DAC channel has a number of stages arranged in the following order: a DAC, a first amplification stage, and a second amplification stage. Each DAC channel also has an output terminal (e.g. a bump, pin, leadframe, ball etc.) coupled to the output of the respective second amplification stage. Each DAC channel operates to convert a respective digital signal to a respective analog signal, and to output the analog signal to the respective output bump. The integrated circuit also has a network of switches interconnected between the DAC channels. The network of switches allows for one or more stages from a (donor) DAC channel to be combined with another (recipient) DAC channel, to improve the performance of the recipient DAC channel. Combining a stage of the donor channel with the recipient channel allows a user to operate the recipient channel whilst the donated stage is connected in parallel with the corresponding stage in the recipient channel. The connected stages have substantially the same design, architecture and/or functionality. This can be achieved by setting a state of the switches such that the input and/or the output of the donated stage is short circuited or connected with the corresponding input and/or output of a corresponding stage in the recipient channel, respectively. For example, if the second amplification stage of the donor channel is being combined with the recipient channel, then the switches may be set to provide a short circuit between the input of the second amplification stage of the donor channel and the input of the second amplification stage of the recipient channel. A user may then short-circuit the output terminals of both channels so that the second amplifications stages operate in parallel. Alternatively or additionally, if the first amplification stage of the donor channel is being combined with the recipient channel, then the switches may be set to provide a short circuit between the input of the first amplification stage of the donor channel and the input of the first amplification stage of the recipient channel. The switches may also be set to also provide a short circuit between the output of the first amplification stage of the donor channel and the output of the first amplification stage of the recipient channel. Consequently, the first stage of the donor channel and the first stage of the recipient channel will be connected in parallel. Moreover, if the DAC of the donor channel is being combined with the DAC of the recipient channel, then the switches may be set to provide a short circuit between the output of the DAC of the donor channel and the output of the DAC of the recipient channel. A user can then supply the same digital signal to both of the DACs. Consequently, the DAC of the donor channel and the DAC of the recipient channel will be operating in parallel.

Different performance enhancements may be observed when different combinations of stages from the donor channel are combined with corresponding stages in the recipient channel. The integrated circuit can include means for allowing a user to choose which stage(s) of the donor channel are combined with the recipient channel. This allows the user to configure the DAC channels based on the user's individual performance requirements. For example, the integrated circuit can include a controller that controls the states of the switches. The integrated circuit can also include means for providing user input (such as one or more input terminals) to communicate with the controller to choose or change the states of the switches. For example, a user can provide a control signal to the integrated circuit to choose how the stages are interconnected.

As a result of this technique, the functionality of the "donor" DAC channel is sacrificed, and therefore the number of operational channels on the integrated circuit is reduced. However, by sacrificing the components of the donor channel for the performance enhancements to the recipient channel, additional on-chip circuitry is not required and therefore there can be significant savings in chip area. Moreover, the remaining non-donated components of the donor channel can be powered down to reduce the overall power consumption of the integrated circuit. It has been observed that users' are willing to sacrifice DAC channel count in order to obtain their desired performance characteristics in the remaining DAC channels, whilst preserving small chip sizes and minimising power consumption.

Figure 15:
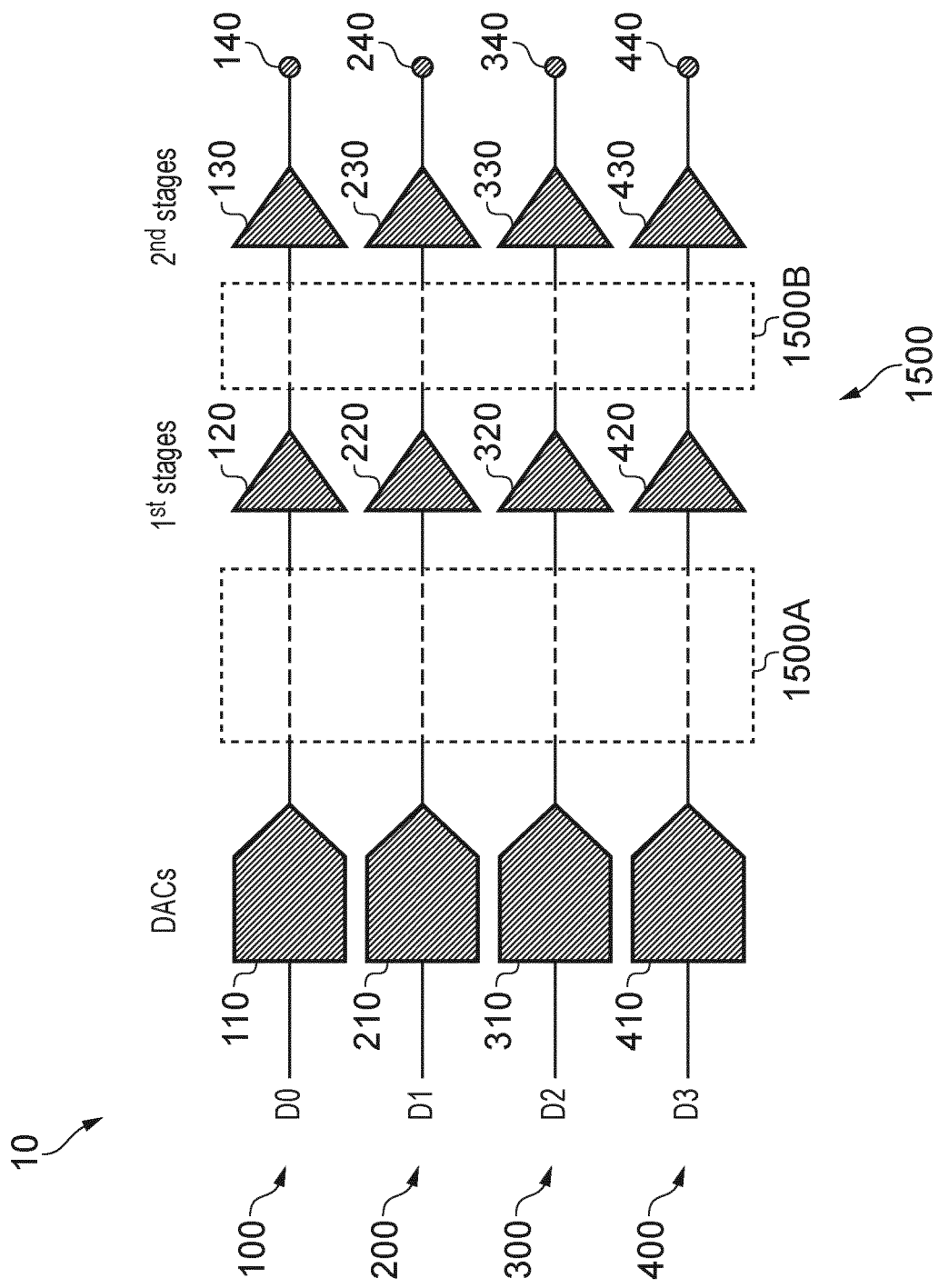
FIG. 15 shows an integrated circuit comprising a plurality of DAC channels according to an example of the present disclosure.

Reference is first made to FIG. 15 which illustrates an integrated circuit 10 according to an example of the present disclosure. The integrated circuit 10 comprises a first channel 100, a second channel 200, a third channel 300 and a fourth channel 400. Each of the channels 100, 200, 300, 400 may be considered as digital-to-analog converter (DAC) channels. Each channel has a DAC, and a number of amplification stages, which can be considered as sub-stages of the channel. The integrated circuit 10 also includes a connecting network 1500 formed of a first connecting block 1500A and a second connecting block 1500B. Preferably, each channel has substantially the same architecture or design.

The first channel 100 comprises a DAC 110, a first amplifier stage 120, a second amplifier stage 130 and an output terminal 140. The DAC 110 has an input and an output. The DAC 110 is arranged to receive a digital signal D0 at its input. The output of the DAC 110 is coupled to an input of the first amplifier stage 120 via the connecting block 1500A. An output of the first amplifier stage 120 is coupled to an input of the second amplifier stage 130 via the connecting block 1500B. An output of the second amplifier stage 130 is coupled to the output terminal 140. The first channel 100 has a signal path that propagates through the DAC 110, the first amplifier stage 120, and the second amplifier stage 130 to the output terminal 140.

The second channel 200 comprises a DAC 210, a first amplifier stage 220, a second amplifier stage 230 and an output terminal 240. The DAC 210 has an input and an output. The DAC 210 is arranged to receive a digital signal D1 at its input. The output of the DAC 210 is coupled to an input of the first amplifier stage 220 via the connecting block 1500A. An output of the first amplifier stage 220 is coupled to an input of the second amplifier stage 230 via the connecting block 1500B. An output of the second amplifier stage 230 is coupled to the output terminal 240. The second channel 200 has a signal path that propagates through the DAC 210, the first amplifier stage 220, and the second amplifier stage 230 to the output terminal 240.

The third channel 300 comprises a DAC 310, a first amplifier stage 320, a second amplifier stage 330 and an output terminal 340. The DAC 310 has an input and an output. The DAC 310 is arranged to receive a digital signal D2 at its input. The output of the DAC 310 is coupled to an input of the first amplifier stage 320 via the connecting block 1500A. An output of the first amplifier stage 320 is coupled to an input of the second amplifier stage 330 via the connecting block 1500B. An output of the second amplifier stage 330 is coupled to the output terminal 340. The third channel 300 has a signal path that propagates through the DAC 310, the first amplifier stage 320, and the second amplifier stage 330 to the output terminal 340.

The fourth channel 400 comprises a DAC 410, a first amplifier stage 420, a second amplifier stage 430 and an output terminal 440. The DAC 410 has an input and an output. The DAC 410 is arranged to receive a digital signal D3 at its input. The output of the DAC 410 is coupled to an input of the first amplifier stage 420 via the connecting block 1500A. An output of the first amplifier stage 420 is coupled to an input of the second amplifier stage 430 via the connecting block 1500B. An output of the second amplifier stage 430 is coupled to the output terminal 440. The fourth channel 400 has a signal path that propagates through the DAC 410, the first amplifier stage 420, and the second amplifier stage 430 to the output terminal 440.

Each DAC 110, 210, 310, 410 is configured to convert the respective digital signal D0, D1, D2, D3 at its input to an analog signal, and output the analog signal to its respective output. Each DAC can be designed according to any techniques known in the art. Preferably, each DAC is configured to output the analog signal as a voltage signal. Furthermore, it is preferable that each DAC has substantially the same architecture or design.

Each first amplifier stage 120, 220, 320, 420 is configured to amplify a voltage signal at its respective input. Each first amplifier stage 120, 220, 320, 420 outputs an amplified voltage signal at its respective output. Each first amplifier stage can be designed according to any techniques known in the art. For example, each first amplifier stage 120, 220, 320, 420 may comprise an operational amplifier (opamp) and/or a difference amplifier. In some examples, each opamp or difference amplifier may be provided in an inverting or non-inverting feedback configuration. Each of the first amplifier stages may comprise further components and circuitry arranged according to known techniques, so that each of the first amplifier stages has a desired amplification characteristic (e.g. a desired gain). For example, each of the first amplifier stages may further comprise one or more of: passive components (resistors, capacitors and/or inductors), transistors (e.g. MOSFETs) and cascades of several amplification stages. It is also understood in the art that the design of the first amplifier stage can impact and define certain other performance characteristics of the respective DAC channel, including closed loop performance, accuracy and precision of the channel. Each first amplifier stage can be designed according to any techniques known in the art in order to achieve desired performance characteristics of the respective channel, such techniques including the use of current mirrors, multiple cascading stages, resistor degeneration, and gain boosted cascading. Preferably, each of the first amplifier stages are designed to be substantially the same in architecture or design, and/or have the same amplification characteristics.

Each second amplifier stage 130, 230, 330, 430 is configured to amplify a voltage signal at its respective input. Each second amplifier stage 130, 230, 330, 430 outputs an amplified voltage signal at its respective output. Each second amplifier stage can be designed according to any techniques known in the art. For example, each second amplifier stage 130, 230, 330, 430 may be a class A, B or AB amplifier. As such, the second amplifier stages may perform a different type of amplification in comparison to the first stages. The second amplifier stage may be designed to sufficiently drive a load connected to the respective output terminal of the channel. To achieve higher drive capabilities, each second amplifier stage may include two or more amplifiers (e.g. class A, B or AB) connected in parallel. Preferably, each of the second amplifier stages are designed to be substantially the same in architecture or design, and/or to have the same amplification characteristics.

Each pair of amplifier stages 120/130, 220/230, 320/330 and 420/430 together forms an output stage of the respective channel 100, 200, 300 and 400. Each output stage is designed to perform suitable amplification and signal conditioning so that the output of the respective DAC 110, 210, 310, 410 can be supplied to the respective output terminal 140, 240, 340, 440 to be taken off-chip.

The connecting blocks 1500A and 1500B include circuit elements (not shown) that are changeable between a short circuit and an open circuit state. The circuit elements can be any suitable type of device, such as switches, fuses or multiplexers. The circuit elements in the block 1500A are interconnected between the outputs of the DACs 110-410 and the inputs to the first amplifier stages 120-420. The circuit elements in block 1500B are interconnected between the outputs of the first amplifier stages 120-420 and the inputs to the second amplifier stages 130-430. The states of the circuit elements determine how the DACs, the first amplifier stages and the second amplifier stages connect together.

Normally, the DAC, first amplifier stage and second amplifier stage of each channel will be connected in series. The signal paths of each channel will be separate from one another, and therefore the integrated circuit 10 provides four separate channels. This is indicated in FIG. 15 by the dashed lines through the connecting blocks 1500A and 1500B. However, by choosing certain combinations of the circuit elements in the connecting network 1500, stages from the channels 200-400 can be made to operate in combination with the channel 100. In particular, one or more stages from the channels 200-400 can be combined with the first channel 100, to improve the functionality and performance of the channel 100. In other words, stages from the channels 200-400 can be donated to the channel 100 to improve the performance of the channel 100. The functionality of the channel(s) from which the donated stage(s) is taken, is effectively sacrificed. This reduces the number of overall channels available to the user. However, this can lead to various performance improvements in the first channel 100, without requiring extra redundant circuitry on-chip.

The integrated circuit 10 allows the DAC 110 to be connected and operated in parallel to the DAC 210. This can be achieved by setting certain circuit element(s) in the block 1500A in a short circuit state, to connect the output of the DAC 110 to the output of the respective DAC 210. As such, the output of the DAC 210 is connected to the signal path of the channel 100. This enables the DACs 110 and 210 to be operated in parallel. The signal D0 can be supplied to the input of both DACs 110 and 210. This can be achieved by separately supplying the signal D0 to the inputs of each DAC 110 and 210. Alternatively, the connecting network 1500 can include circuit elements at the inputs to the DACs, which can be short circuited to connect the input of the DAC 210 to the input of the DAC 110, so that the DAC 210 receives the signal D0. It will be appreciated that the DAC 310 and the DAC 410 can also be made to operate in parallel with each other, in a similar way. It will also be appreciated that the DAC 310 and/or the DAC 410 can also be made to operate in parallel with the DAC 110, in a similar way.

The integrated circuit 10 also allows the first amplifier stage 120 to be connected and operated in parallel to the first amplifier stage 220. This can be achieved by setting certain circuit element(s) in the block 1500A in a short circuit state, to connect the input to the first amplifier stage 120 to the input to the first amplifier stage 220. As such, the input to the first amplifier stage 220 is connected to the signal path of the first channel 100. Furthermore, certain circuit element(s) in the block 1500B can be set to a short circuit state to connect the output of the first amplifier stage 120 to the output of the first amplifier stage 220. As such, the output of the first amplifier stage 220 is connected to the signal path of the first channel 100. This enables the first amplifier stages 120 and 220 to be operated in parallel. It will be appreciated that the first amplifier stage 320 and the first amplifier stage 420 can also be made to operate in parallel with each other, in a similar way. It will also be appreciated that the first amplifier stage 320 and/or the first amplifier stage 420 can also be made to operate in parallel with the first amplifier stage 120, in a similar way.

The integrated circuit 10 also allows the second amplifier stage 130 to be connected and operated in parallel to the second amplifier stage 230. This can be achieved by setting certain circuit element(s) in the block 1500B in a short circuit state, to connect the input to the second amplifier stage 130 to the input to the second amplifier stage 230. As such, the input to the second amplifier stage 230 is connected to the signal path of the first channel 100. This enables the second amplifier stages 130 and 230 to be operated in parallel. A user can short circuit the output terminals 140 and 240 to connect the outputs of the second amplifier stages 130 and 230 together. Alternatively, the connecting network 1500 can include circuit elements at the outputs of the second amplifier stages 130 and 230, which can be short circuited to connect the output of the second amplifier stage 130 to the output of the second amplifier stage 230. It will be appreciated that the second amplifier stage 330 and the second amplifier stage 430 can also be made to operate in parallel with the second amplifier stage 130, in a similar way. It will also be appreciated that the second amplifier stage 330 and/or the second amplifier stage 430 can also be made to operate in parallel with the second amplifier stage 130, in a similar way.

Although not shown in FIG. 15, the integrated circuit 10 may be configured to receive user input so that a user can choose the states of the circuit elements in the connecting network 1500. The user input can be received as a control signal via one or more input terminals to the integrated circuit 10, via wireless communications means, or via a module of a system on-chip (SoC) or System in a Package (SiP) architecture of the integrated circuit 10. For example, the integrated circuit 10 may comprise a controller that is configured to receive user input and control the states of the circuit elements based on the user input. Alternatively, the integrated circuit 10 may be configured to receive control signals from an external controller, e.g. via input terminals, and change the states of the switches based on the received control signals.

Different advantages may be associated with operating combinations of the DACs 110-410, first amplifier stages 120-420 and second amplifier stages 130-430 in parallel. Therefore, a user can decide which and how many stages from the channels 200-400 to combine with the first channel 100. The user's choice may depend on the number of operational channels they require, and the performance requirements for those channels.

FIG. 1 illustrates an example implementation of the integrated circuit 10 of FIG. 15. In particular, FIG. 1 illustrates an example implementation of the connecting network 1500. The example of FIG. 1 is used to show examples of circuit configurations and operating modes that can be achieved with the integrated circuit 10, and the associated advantages of each configuration. However, it will be appreciated that implementations of the connecting network 1500 different to what is shown in FIG. 1 and described below may be used to achieve similar connectivity and advantages.

The integrated circuit 10 comprises a number of switches 51, 52, 53, 54, 62, 64, 66, 70, 80, 90 interconnected between the channels 100, 200, 300, 400. In particular, the connecting block 1500A comprises the switches 51, 52, 53, 54, 62, 64, and 66. The connecting block 1500B comprises the switches 70, 80 and 90.

As shown in the example of FIG. 1, the output of the DAC 110 is coupled to the input of the first amplifier stage 120 via the switch 51. The output of the first amplifier stage 120 is coupled to the input of the second amplifier stage 130. The output of the second amplifier stage 130 is coupled to the output terminal 140. The output of the DAC 210 is coupled to the input of the first amplifier stage 220 via the switch 52. The output of the first amplifier stage 220 is coupled to the input of the second amplifier stage 230. The output of the second amplifier stage 230 is coupled to the output terminal 240. The output of the DAC 310 is coupled to the input of the first amplifier stage 320 via the switch 53. The output of the first amplifier stage 320 is coupled to the input of the second amplifier stage 330. The output of the second amplifier stage 330 is coupled to the output terminal 340. The output of the DAC 410 is coupled to the input of the first amplifier stage 420 via the switch 54. The output of the first amplifier stage 420 is coupled to the input of the second amplifier stage 430. The output of the second amplifier stage 430 is coupled to the output terminal 440.

The switch 62 is coupled between the inputs to the first amplifier stage 120 and the first amplifier stage 220. The switch 64 is coupled between the inputs to the first amplifier stage 220 and the first amplifier stage 320. The switch 66 is coupled between the inputs to the first amplifier stage 320 and the first amplifier stage 420. The switch 70 is coupled between the inputs to the second amplifier stage 130 and the second amplifier stage 230. The switch 80 is coupled between the inputs to the second amplifier stage 230 and the second amplifier stage 330. The switch 90 is coupled between the inputs to the second amplifier stage 330 and the second amplifier stage 430.

Each of the switches 51, 52, 53, 54, 62, 64, 66, 70, 80, 90 are able to have a short circuit state and an open circuit state. In a short circuit state of a switch, the switch provides a short circuit between the nodes on either side of the switch. In an open circuit state of a switch, the switch provides an open circuit between the nodes on either side of the switch. Although switches are described, it will be appreciated that the switches can be replaced by any other suitable circuit element that is changeable between an open circuit and a short circuit state, such as fuses or multiplexers.

Although not shown in FIG. 1, the integrated circuit 10 may be configured to receive user input so that a user can choose the states of each of the switches 51, 52, 53, 54, 62, 64, 66, 70, 80, 90. For example, the integrated circuit 10 may comprise a controller that is configured to receive user input and control the states of the switches based on the user input. Alternatively, the integrated circuit 10 may be configured to receive control signals from an external controller and change the states of the switches based on the received control signals. In some examples, the control signals can be inputted to the integrated circuit 10 via an input terminal of the integrated circuit, via wireless communications means, or via a module of a system on-chip (SoC) or System in a Package (SiP) architecture of the integrated circuit. As discussed below, users can set specific combinations of states of the switches to achieve their desired performance characteristics for the channels that are in use. The states of the switches chosen by the user may depend on their specific performance requirements for the channels they use, such as: channel count, power usage, output impedance, voltage headroom, DC offset, noise, integral non-linearity (INL) and differential non-linearity (DNL). Examples of different combinations of states of the switches and their merits are described in more detail below.

Figure 2:
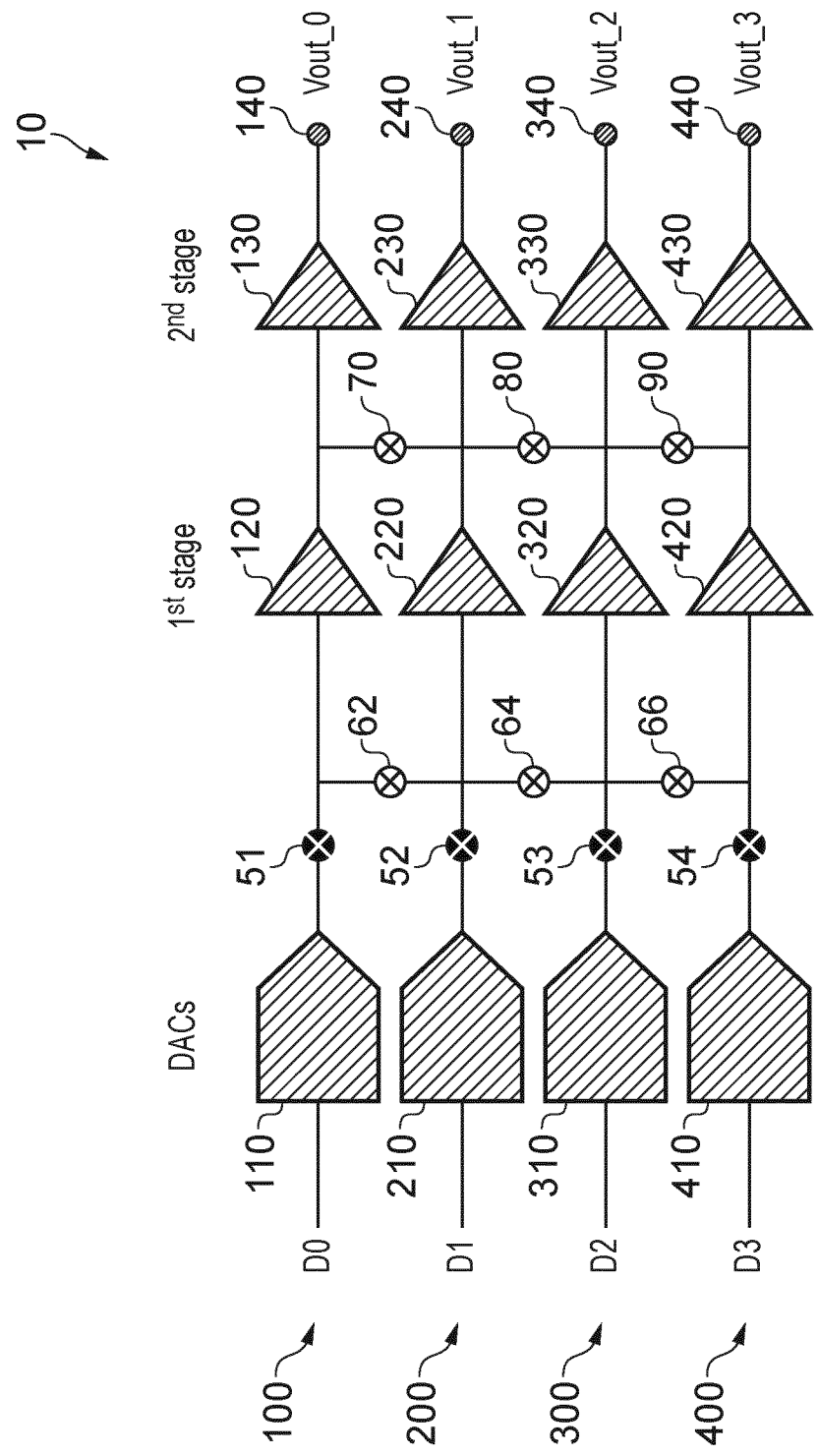
FIG. 2 shows the integrated circuit of FIG. 1 under a set of example operating conditions.

FIG. 2 illustrates the integrated circuit 10 with an example combination of states of the switches. As shown, the switches 51, 52, 53, 54 are in a short circuit (e.g. closed) state. The remaining switches 62, 64, 66, 70, 80, 90 are in an open circuit (e.g. open) state. Therefore, the output of the DAC 110 is electrically connected to the input to the first amplification stage 120 of the same channel. Similarly, the output of the DAC 210 is connected to the input of the first amplification stage 220. The output of the DAC 310 is connected to the input of the first amplification stage 320. The output of the DAC 410 is connected to the input of the first amplification stage 420.

However, the input to the first amplifier stage 120 of the first channel 110 remains electrically disconnected from the input to the first amplifier stage 220 of the second channel 220. Similarly, the input to the first amplifier stage 220 remains electrically disconnected from the input to the first amplifier stage 320, and the input to the first amplifier stage 320 remains electrically disconnected from the input to the first amplifier stage 420.

Furthermore, the input to the second amplifier stage 130 of the first channel 110 remains electrically disconnected from the input to the second amplifier stage 230 of the second channel 220. Similarly, the input to the second amplifier stage 230 remains electrically disconnected from the input to the second amplifier stage 330, and the input to the second amplifier stage 330 remains electrically disconnected from the input to the second amplifier stage 430.

Advantageously, in the configuration of FIG. 2, each of the channels 100, 200, 300 and 400 can be operated independently of one another. In particular, the first channel 100 can be operated to generate the signal Vout_0 which is an analog representation of the digital signal D0, by supplying the signal D0 to the DAC 110. The second channel 200 can be operated to generate the signal Vout_1 which is an analog representation of the digital signal D1, by supplying the signal D1 to the DAC 210. The third channel 300 can be operated to generate the signal Vout_2 which is an analog representation of the digital signal D2, by supplying the signal D2 to the DAC 310. The fourth channel 400 can be operated to generate the signal Vout_3 which is an analog representation of the digital signal D3, by supplying the signal D3 to the DAC 410. The digital signals D0, D1, D2, D3 may be supplied to the inputs of the respective DACs 110, 210, 310, 410 from off-chip circuitry, for example via respective input terminals or pins of the integrated circuit 10 (not shown). Alternatively or additionally, any one or more of the digital signals D0, D1, D2, D3 may be supplied to the inputs of the respective DACs 110, 210, 310, 410 from other on-chip circuitry on the integrated circuit 10.

Simulation results of the configuration shown in FIG. 2 reveal the following baseline performance characteristics for each channel 100, 200, 300, 400:

| Characteristic | Value |
| --- | --- |
| Channels available | 4 |
| 16b INL/DNL | 2/1 |
| Voltage Headroom, iout = 15 mA | 100 mV |
| Iout for V Headroom = 100 mV | 15 mA |
| Offset | 2 mV |
| Noise @ 10 kHz nV/sqrt(Hz) | 80 |

As such, a user may wish to use all four of the channels 100, 200, 300, 400 whilst being satisfied with the above baseline performance characteristics of the individual channels. Such a user may therefore set the states of the switches as shown in FIG. 2 to achieve the desired performance. It will be appreciated that the above values are only examples of baseline performance values for the purpose of the present disclosure. The baseline performance values may differ depending on the exact implementation.

Figure 3:
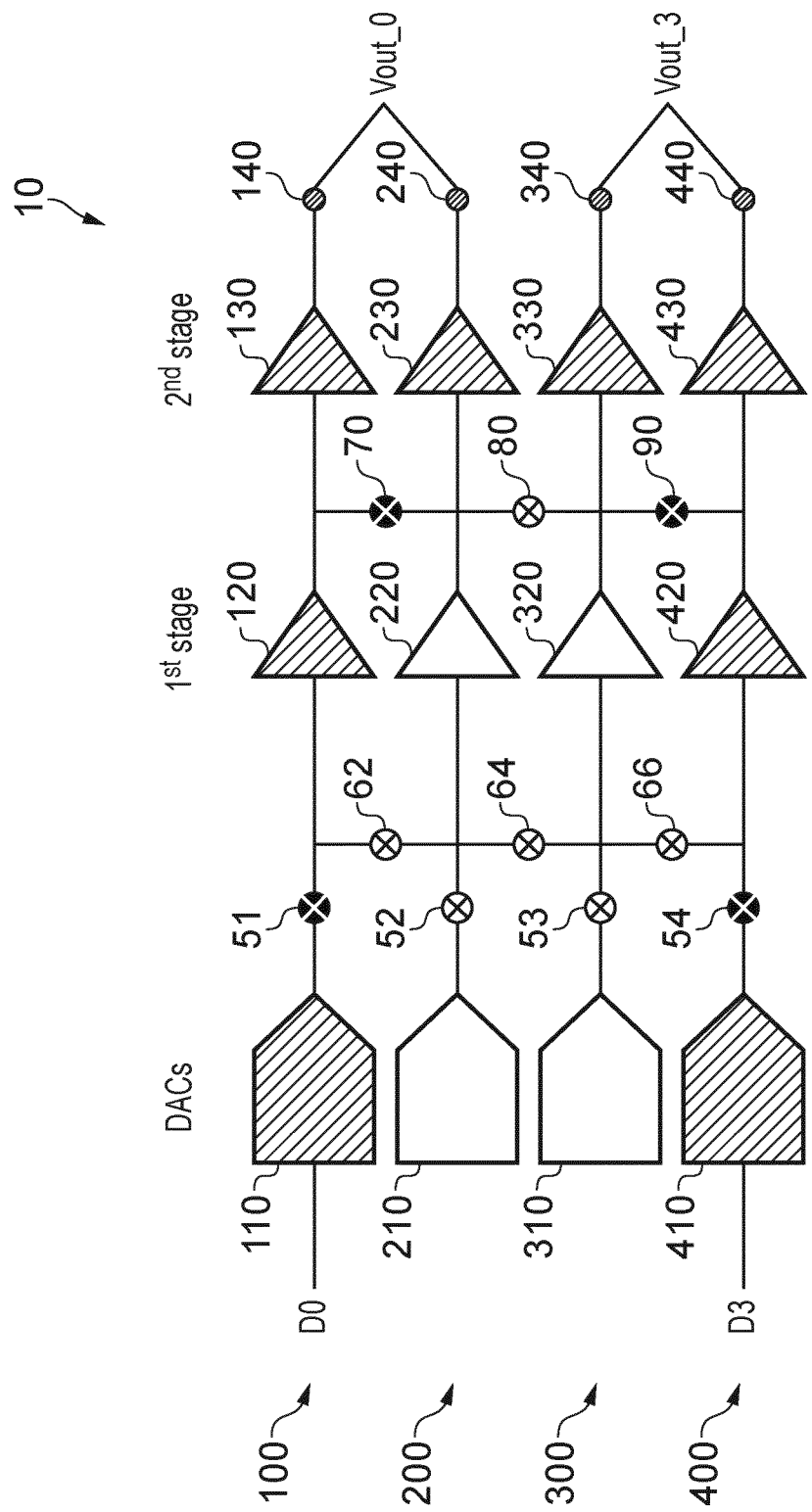
FIG. 3 shows the integrated circuit of FIG. 1 under another set of example operating conditions.

FIG. 3 illustrates the integrated circuit 10 with another example combination of states of the switches. In the example of FIG. 3, the states of the switches are set such that the second amplifier stage 230 of the second channel 200 can be used in combination with the first channel 100 in order to improve the performance of the first channel 100; and the second amplifier stage 330 of the third channel 300 can be used in combination with the fourth channel 400 in order to improve the performance of the fourth channel 400. However, the channel count is reduced because the second channel 200 and the third channel 300 cannot be used independently.

As shown in FIG. 3, the switches 51, 54, 70 and 90 are in a short circuit state. The switches 62, 64, 66, 80 are in an open circuit state. Optionally, the switches 52 and 53 are also in an open circuit state. Therefore, the output of the DAC 110 is electrically connected to the input to the first amplification stage 120 of the same first channel 100. Furthermore, the input to the second stage 130 of the first channel 100 is electrically connected to the input to the second stage 230 of the second channel 200. In other words, the inputs to the second amplifier stages 130 and 230 are short circuited. Similarly, the output of the DAC 410 of the fourth channel 400 is electrically connected to the input of the first amplifier stage 420 of the same channel 400. Furthermore, the input to the second stage 430 of the fourth channel 400 is electrically connected to the input to the second stage 330 of the third channel 300. In other words, the inputs to the second amplifier stages 330 and 430 are short circuited.

However, the input to the first amplifier stage 120 of the first channel 110 remains electrically disconnected from the input to the first amplifier stage 220 of the second channel 220. Similarly, the input to the first amplifier stage 220 remains electrically disconnected from the input to the first amplifier stage 320, and the input to the first amplifier stage 320 remains electrically disconnected from the input to the first amplifier stage 420. Moreover, the input to the second stage 230 remains electrically disconnected from the input to the second amplifier stage 330. Optionally, the output of the DAC 210 is disconnected from the input of the first stage 220, and the output of the DAC 310 is disconnected from the input to the first stage 320.

As a consequence to the switch states in FIG. 3, the second amplifier stage 230 of the second channel 200 receives and amplifies the same signal as the second stage 130 of the first channel 100. In particular, both of the second stages 130 and 230 receive and amplify the output of the first amplifier stage 120 of the first channel 100. Moreover, the first amplifier stage 120 of the first channel only receives and amplifies the output of the DAC 110 of the first channel 100.

Similarly, the second amplifier stage 330 of the third channel 300 receives and amplifies the same signal as the second stage 430 of the fourth channel 400. In particular, both of the second stages 330 and 430 receive and amplify the output of the first amplifier stage 420 of the fourth channel 400. Moreover, the first amplifier stage 420 of the fourth channel only receives and amplifies the output of the DAC 410 of the fourth channel 400.

Advantageously, a user can operate the first channel 100 in combination with the second stage 230 of the second channel 200 to generate the signal Vout_0, whilst observing certain performance enhancements in the first channel 100. The signal Vout_0 is an analog representation of the digital signal D0. A user can externally short circuit the output terminals 140 and 240 of the first and the second channels 100 and 200 as illustrated in FIG. 3. For example, the integrated circuit 10 can be mounted to a PCB, and the output terminals 140 and 240 can be short circuited on the PCB. Therefore, the second stage 230 of the second channel 200 and the second stage 130 of the first channel 100 effectively operate in parallel. The signal D0 can be supplied to the input of the DAC 110 of the first channel 100. The DAC 210 and the first amplifier stage 220 of the second channel 200 are not operational in this configuration since the independent operation of the second channel 200 has effectively been sacrificed in order to donate the second amplifier stage 230 of the second channel to the first channel 100 to improve the performance of the first channel 100. Therefore, a digital signal is not supplied to the DAC 210, and there is no signal path between the DAC 210 and the input to the second stage 230.

Similarly, a user can operate the fourth channel 400 in combination with the second stage 330 of the third channel 300 to generate the signal Vout_3, whilst observing certain performance enhancements in the fourth channel 400. The signal Vout_3 is an analog representation of the digital signal D3. A user can externally short circuit the output terminals 340 and 440 of the third and the fourth channels 300 and 400 as illustrated in FIG. 3. Therefore, the second stage 330 of the third channel 300 and the second stage 430 of the fourth channel 400 effectively operate in parallel. The signal D3 can be supplied to the input of the DAC 410 of the fourth channel 400. The DAC 310 and the first amplifier stage 320 of the third channel 300 are not operational in this configuration since the independent operation of the third channel 300 has effectively been sacrificed in order to donate the second amplifier stage 330 of the third channel to the fourth channel 400, to improve the performance of the fourth channel 400. Therefore, a digital signal is not supplied to the DAC 310 and there is no signal path between the DAC 310 and the input to the second stage 330.

Simulation results of the configuration shown in FIG. 3 reveal the following performance characteristics for the channels 100 and 400:

| Characteristic | Value |
| --- | --- |
| Channels available | 2 |
| 16b INL/DNL | 2/1 |
| Voltage Headroom, iout = 15 mA | 50 mV |
| Iout for V Headroom = 100 mV | 7.5 mA |
| Offset | 2 mV |
| Noise @ 10 kHz | 80 nV/sqrt(Hz) |

As such, it is observed that the first channel 100 and the fourth channel 400 achieves a lower voltage headroom in comparison to the channels in the arrangement shown in FIG. 2. However, this comes at the cost of there being fewer channels available to the user. It has also been observed that the outputs of the first channel 100 and the fourth channel 400 may achieve a lower output impedance in comparison to the channels in FIG. 2.

Optionally, in the arrangement of FIG. 3, the unused first stages 220 and 320 may be powered down. For example, the first stages 220 and 320 may configured to cause their outputs to float when they are not in use. Advantageously, this may reduce the power consumption of the integrated circuit 10 as fewer active components are being used. Additionally or alternatively, the unused DACs 210 and 310 may also be powered down in a similar way to further reduce the power consumption of the integrated circuit 10.

Figure 4:
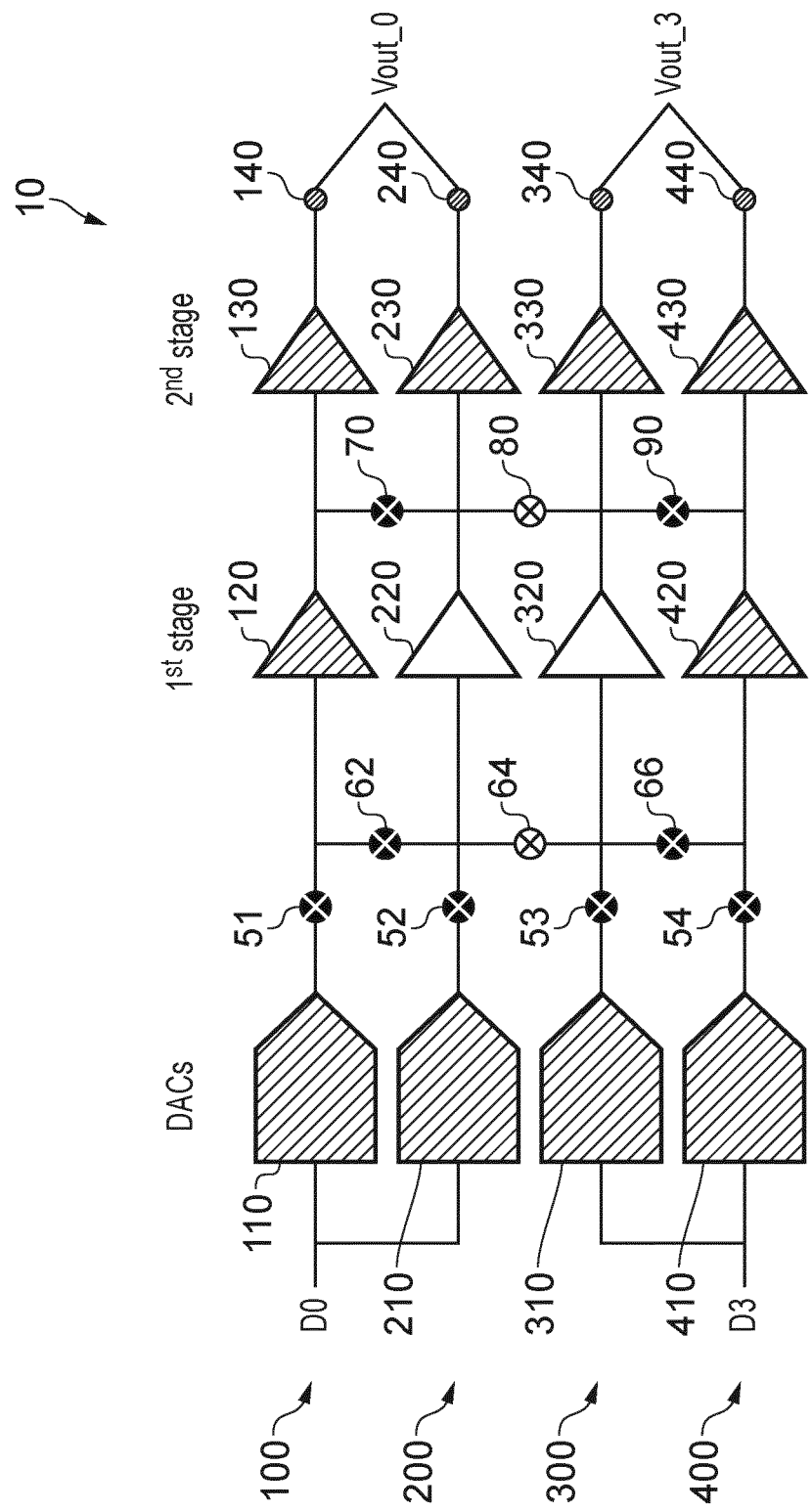
FIG. 4 shows the integrated circuit of FIG. 1 under another set of example operating conditions.

FIG. 4 illustrates the integrated circuit 10 with another example combination of states of the switches. Similarly to the example of FIG. 3 the states of the switches are set such that the second amplifier stage 230 of the second channel 200 can be used with the first channel 100 in order to improve the performance of the first channel 100; and the second amplifier stage 330 of the third channel 300 can be used with the fourth channel 400 in order to improve the performance of the fourth channel 400. However, the example of FIG. 4 differs from the example of FIG. 3 in that the switches are set so that the DAC 210 of the second channel 200 can also be used with the first channel 100 in order to further improve the performance of the first channel 100; and the DAC 310 of the third channel 300 can also be used with the fourth channel 400 in order to improve the performance of the fourth channel 400. Consequently, the channel count is reduced and the second channel 200 and the third channel 300 cannot be used independently.

As shown in FIG. 4, the switches 51, 52, 53, 54, 62, 66, 70 and 90 are in a short circuit state. The remaining switches 64 and 80 are in an open circuit state. Furthermore, the first amplifier stages 220 and 320 are powered down as described above in respect of FIG. 3. Alternatively or additionally, the input to the first amplifier stage 220 can be disconnected from the outputs of the DACs 110 and 210, for example by opening an additional switch (not shown) provided in series at the input to the first amplifier stage 220. Similarly, the first amplifier stage 320 can be disconnected from the outputs of the DACs 310 and 410, for example by opening an additional switch (not shown) provided in series with the input to the first stages 320.

Therefore, the arrangement of FIG. 4 differs from FIG. 3 in that the output of the DAC 210 of the second channel 200 is electrically connected to the output of the DAC 110 of the first channel, via the switches 52, 62, and 51. In other words, the outputs of the DACs 110 and 210 are short circuited. Similarly, the output of the DAC 310 of the third channel 300 is electrically connected to the output of the DAC 410 of the fourth channel, via the switches 53, 66 and 54. In other words, the outputs of the DACs 310 and 410 are short circuited. As in FIG. 3, the inputs of the first amplifier stages 220 and 320 remain electrically disconnected due to the open state of the switch 64. Furthermore, the inputs of the second stages 230 and 330 remain electrically disconnected due to the open state of the switch 80. Furthermore, since the first stages 220 and 320 are powered down, there is no signal paths through the first stages 220 and 320.

Advantageously, a user can operate the first channel 100 in combination with the second stage 230 and the DAC 210 of the second channel 200 to generate the signal Vout_0, whilst observing further performance enhancements for the first channel 100. The signal Vout_0 is an analog representation of the digital signal D0. A user can externally short circuit the output terminals 140 and 240 of the first and the second channels 100 and 200 as illustrated in FIG. 4. Therefore, the second stage 230 of the second channel 200 and the second stage 130 of the first channel 100 effectively operate in parallel. Furthermore, the digital signal D0 can be supplied to the input of the DAC 110 of the first channel 100 and the DAC 210 of the second channel 200. Therefore, the DAC 110 of the first channel and the DAC 210 of the second channel 200 also effectively operate in parallel. In one example, the signal D0 can be supplied to the input of the DAC 210 by closing an additional switch that is coupled between the inputs of the DACs 110 and 210 (not shown). Alternatively, the signal D0 can be separately supplied to the input of the DAC 210 in addition to the input of the DAC 110.

Similarly, a user can operate the fourth channel 400 in combination with the second stage 330 and the DAC 310 of the third channel 300 to generate the signal Vout_3, whilst observing further performance enhancements for the fourth channel 400. The signal Vout_3 is an analog representation of the digital signal D3. A user can externally short circuit the output terminals 340 and 440 of the third and the fourth channels 300 and 400 as illustrated in FIG. 4. Therefore, the second stage 330 of the third channel 300 and the second stage 430 of the fourth channel 400 effectively operate in parallel. Furthermore, the digital signal D3 can be supplied to the input of the DAC 410 of the fourth channel 400 and the DAC 310 of the third channel 300. Therefore, the DAC 410 of the fourth channel and the DAC 310 of the third channel 300 also effectively operate in parallel. In one example, the signal D3 can be supplied to the input of the DAC 310 by closing an additional switch that is coupled between the inputs of the DACs 310 and 410 (not shown). Alternatively, the signal D3 can be separately supplied to the input of the DAC 310 in addition to the input of the DAC 410.

Simulation results of the configuration shown in FIG. 4 reveal the following performance characteristics for the channels 100 and 400:

| Characteristic | Value |
| --- | --- |
| Channels available | 2 |
| 16b INL/DNL | 1.4/1 |
| Voltage Headroom, iout = 15 mA | 50 mV |
| Iout for | 7.5 mA |
| V Headroom = 100 mV | |
| Offset | 2 mV |
| Noise @ 10 kHz | 57 nV/sqrt(Hz) |

Like the arrangement of FIG. 3, it can be observed that the first channel 100 and the fourth channel 400 achieve a lower voltage headroom, and may also achieve a lower output impedance. However, the performance of the arrangement of FIG. 4 is further improved in that the channels 100 and 400 achieve lower noise and INL/DNL errors. For example, the outputs of the DACs 110/210 and 310/410 may be said to average to improve the error performance. In comparison to the arrangement of FIG. 3, this comes at the cost of higher power consumption since the DACs 210 and 310 are powered on and in use in FIG. 4.

Figure 5:
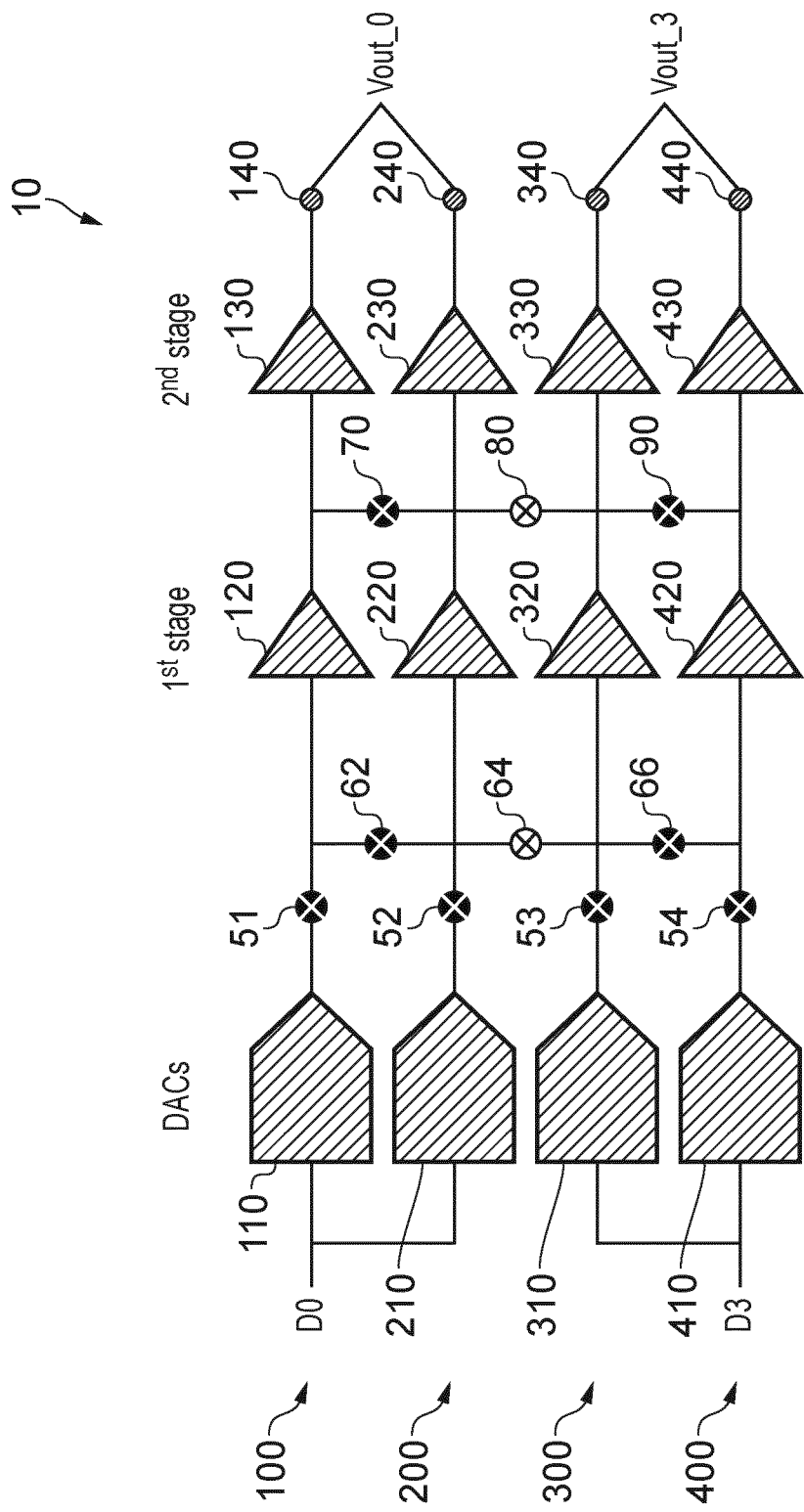
FIG. 5 shows the integrated circuit of FIG. 1 under another set of example operating conditions.

FIG. 5 illustrates the integrated circuit 10 according to another example state of operation. FIG. 5 differs from FIG. 4 in that the first amplifier stage 220 of the second channel 200 is powered on and connected in parallel to the first amplifier stage 120 of the first channel 100. Furthermore, the first amplifier stage 320 of the third channel is powered on and connected in parallel to the first amplifier stage 420 of the fourth channel 400. Advantageously, in the arrangement of FIG. 5, the first amplifier stage 220 of the second channel can be used in combination with the first channel 100 to further improve the performance of the first channel 100. The first amplifier stage 320 of the third channel can be used in combination with the fourth channel 400 to further improve the performance of the fourth channel 400. In particular, a user can operate the integrated circuit 10 of FIG. 5 as described above for FIG. 4, in order to achieve further performance enhancements.

Simulation results of the configuration shown in FIG. 5 reveal the following performance characteristics for the channels 100 and 400:

| Characteristic | Value |
| --- | --- |
| Channels available | 2 |
| 16b INL/DNL | 1.4/1 |
| Voltage Headroom, iout = 15 mA | 50 mV |
| Iout for | 7.5 mA |
| V Headroom = 100 mV | |
| Offset | 1.4 mV |
| Noise @ 10 kHz | 57 nV/sqrt(Hz) |

It can be observed that the first channel 100 and the fourth channel 400 achieve the same performance enhancements as described above for FIG. 4. However, with the arrangement of FIG. 5, the DC offset is further reduced. This comes at the cost of higher power consumption than the arrangement of FIG. 4, since the first amplifier stages 220 and 320 are powered on and in use.

Figure 6:
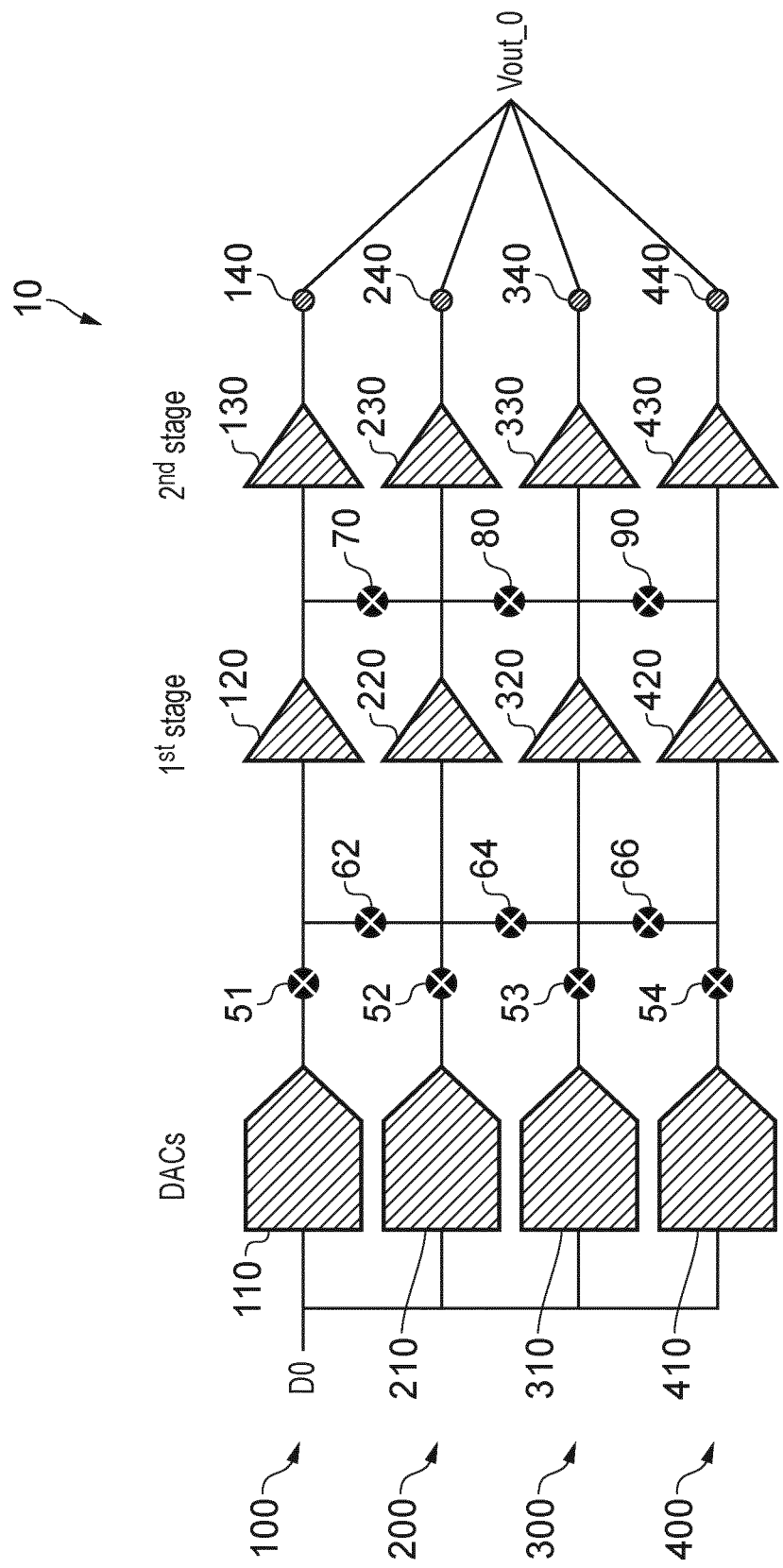
FIG. 6 shows the integrated circuit of FIG. 1 under another set of example operating conditions.

FIG. 6 illustrates the integrated circuit 10 according to another example state of operation. In particular, FIG. 6 illustrates an example state of operation in which each DAC, first amplifier stage and second amplifier stage of each of the four channels are combined to greatly improve the performance of first channel 100.

As illustrated in FIG. 6, each of the switches 51, 52, 53, 54, 62, 64, 66, 70, 80, 90 are in a short circuit (i.e. closed)

state. In other words, the arrangement of FIG. 6 differs from FIG. 5 in that the switches 64 and 80 are closed. Consequently, the first amplifier stages 220, 320 and 420 are electrically connected in parallel to the first amplifier stage 120 of the first channel 100. Furthermore, the outputs of each of the DACs 110, 210, 310, 410 are short circuited, and the inputs to each of the second stages 130, 230, 330, 430 are short circuited.

Advantageously, a user can operate the first channel 100 in combination with the second, third and fourth channels 200, 300, 400, to generate the signal Vout_0 whilst observing greater performance enhancements of the first channel 100. The signal Vout_0 is an analog representation of the digital signal D0. A user can externally short-circuit the output terminals 140, 240, 340 and 440 of each of the four channels as illustrated in FIG. 6. Consequently, the second amplifier stages 230, 330 and 430 are electrically connected in parallel to the second amplifier stage 130 of the first channel 100. Furthermore, the digital signal D0 can be supplied to the input of each DAC 110, 210, 310 and 410 of each of the fourth channels. Consequently, each of the DACs 110, 210, 310 and 410 operate in parallel. In one example, the signal D0 can be supplied to the input of the DAC 210 by closing one or more additional switches that are coupled between the inputs of the DACs 110 and 210 (not shown). Alternatively, the signal D0 can be separately supplied to the inputs of each of the DACs.

Simulation results of the configuration shown in FIG. 6 reveal the following performance characteristics for the channel 100:

| Characteristic | Value |
|---|---|
| Channels available | 1 |
| 16b INL/DNL | 1/1 |
| Voltage Headroom, iout = 15 mA | 25 mV |
| Iout for V Headroom = 100 mV | 3.75 mA |
| Offset | 1 mV |
| Noise @ 10 kHz | 40 nV/sqrt(Hz) |

It is observed that each of the performance characteristics in the above table is improved with the arrangement of FIG. 6 in comparison to each of the previous arrangements. However, this comes at great cost to the user in that only one channel (e.g. the first channel 100) is available to the user.

It will be appreciated that a user is not limited to the configurations shown in FIGS. 2-6. Rather, a user can operate the switches in the integrated circuit 10 to realise all different parallel combinations of components (i.e. DACs, first amplifier stages and second amplifier stages) between the channels, examples of which are given below.

Figure 7:
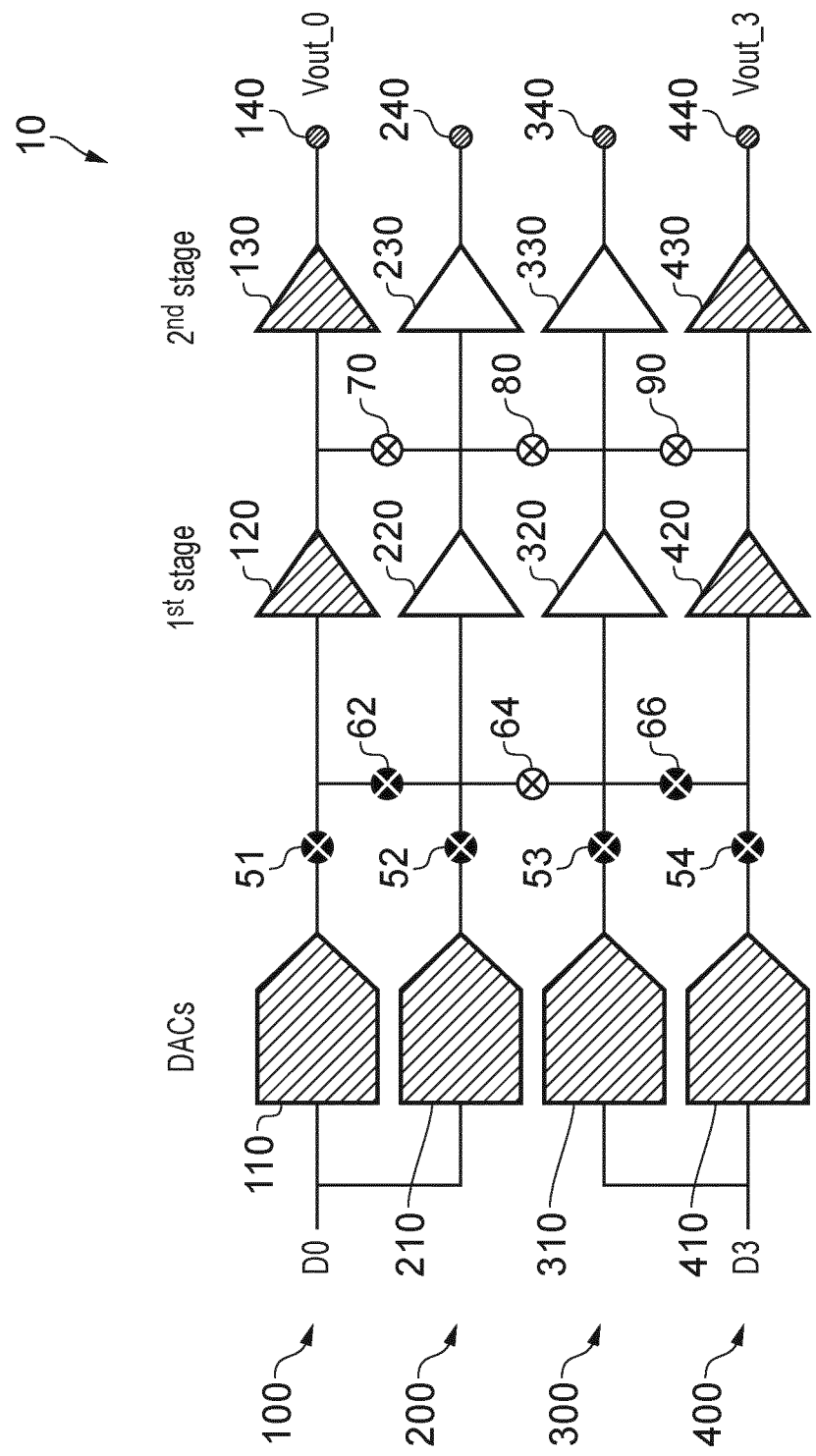
FIG. 7 shows the integrated circuit of FIG. 1 under another set of example operating conditions.

FIG. 7 illustrates a further state of operation of the integrated circuit 10. The arrangement of FIG. 7 is similar to the arrangement in FIG. 4. However, FIG. 7 differs from FIG. 4 in that the switches 70 and 80 are open-circuit. As such, the inputs of the second amplifier stages 130 and 230 are not short circuited and are instead open circuit. Similarly, the inputs of the second amplifier stages 330 and 430 are also open circuit. As such, a user need not externally short-circuit the output terminals 140 and 240, since the second stages 130 and 230 cannot be operated in parallel. Similarly, a user need not externally short-circuit the output terminals 340 and 440, since the second stages 330 and 430 cannot be operated in parallel. Therefore, the user may not achieve a lower output impedance and voltage headroom as per the arrangements in FIGS. 3 and 4. However, the user may still achieve performance enhancements that are associated with combining the DACs 110 and 210, and combining the DACs 310 and 410, such as improvements in noise and INL/DNL characteristics.

Figure 8:
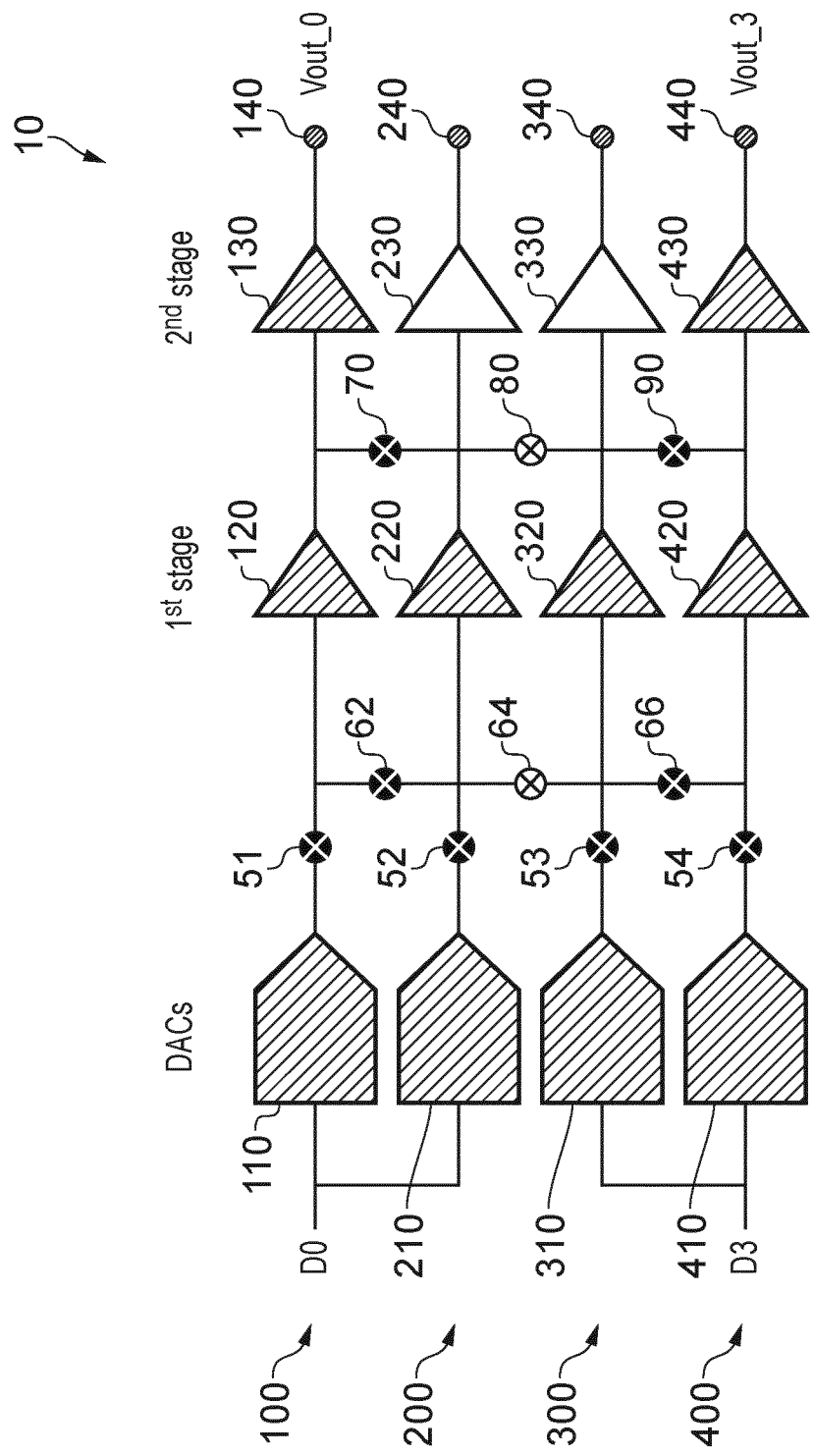
FIG. 8 shows the integrated circuit of FIG. 1 under another set of example operating conditions.

FIG. 8 illustrates a further state of operation of the integrated circuit 10. The arrangement of FIG. 8 is similar to the arrangement in FIG. 5. However, FIG. 8 differs from FIG. 5 in that the second amplifier stages 230 and 330 are powered down. For example, the second amplifier stages 230 and 330 may be configured to cause their outputs to float when the second amplifier stages 230 and 330 are not in use. Alternatively or additionally, the inputs of the second stages 230 and 330 can be disconnected from the rest of the integrated circuit 10, for example using additional series switches (not shown).

As such, the second stages 130 and 230 cannot be operated in parallel. The second stages 330 and 430 also cannot be operated in parallel. Therefore the user need not short-circuit the output terminals 140 and 240, and 340 and 440. The user may not achieve a lower output impedance and voltage headroom as per the arrangements in FIGS. 3 and 4. However, the user may still achieve performance enhancements that are associated with combining the DACs 110/210 and 310/410, such as improvements in noise and INL/DNL characteristics. The user also may still achieve performance enhancements that are associated with combining the first stages 120/220 and 320/420, such as improvements in the DC offset.

Figure 9:
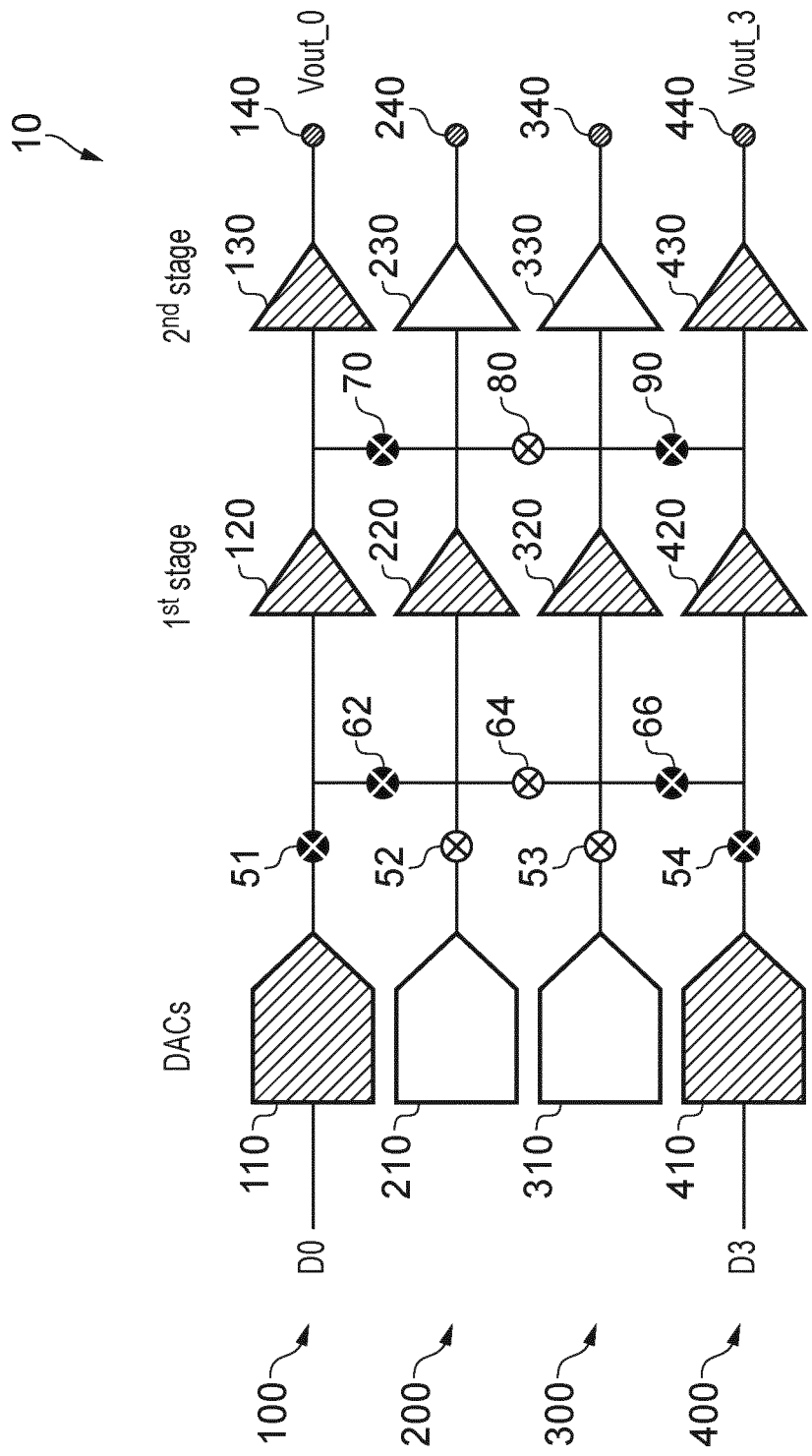
FIG. 9 shows the integrated circuit of FIG. 1 under another set of example operating conditions.

FIG. 9 illustrates a further state of operation of the integrated circuit 10. The arrangement of FIG. 9 is similar to the arrangement in FIG. 8. However, the arrangement in FIG. 9 differs in that the switches 52 and 53 are open circuit. Consequently, the outputs of the DACs 210 and 110 are not short-circuited and are instead open circuit, and so the DACs 210 and 110 cannot be operated in parallel. Similarly, the outputs of the DACs 310 and 410 are not short circuited and so the DACs 310 and 410 also cannot be operated in parallel. Therefore, the user may no longer achieve performance enhancements that are associated with combining the DACs 110/210 and 310/410. However, the DACs 210 and 310 may be powered down thereby resulting in lower power consumption.

Figure 10:
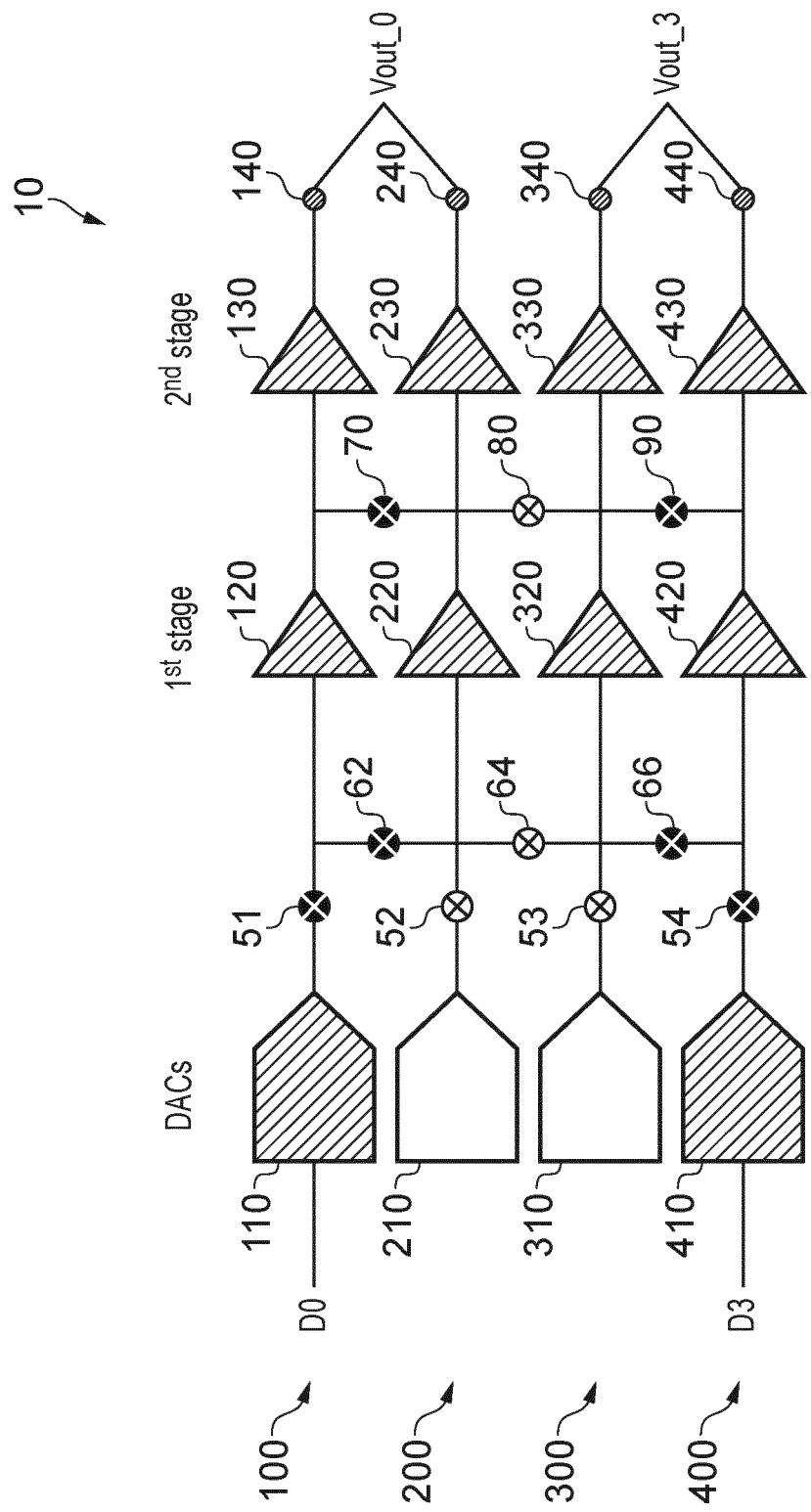
FIG. 10 shows the integrated circuit of FIG. 1 under another set of example operating conditions.

FIG. 10 illustrates a further state of operation of the integrated circuit 10. The arrangement of FIG. 10 is similar to the arrangement of FIG. 5. However, FIG. 10 differs from FIG. 5 in that the switches 52 and 53 are open circuit. Therefore, like the arrangement in FIG. 9, the user may no longer achieve performance enhancements that are associated with combining the DACs 110/210 and 310/410. However, the DACs 210 and 310 may be powered down thereby resulting in lower power consumption.

First Amplifier Stage

With reference to FIG. 5, it was described above how the first stage 120 of the first channel 100 and the first stage 220 of the second channel 200 can be connected to operate in parallel. In particular, the inputs and the outputs to the first stages 120 and 220 can be short circuited.

In some examples, when the first stages 120 and 220 are connected in parallel, high impedance nodes internal to the first stages 120 and 220 are also short circuited. In particular, the first stages 120 and 220 may have substantially the same design and/or architecture. Therefore, high impedance nodes in the first stage 120 are coupled to corresponding high impedance nodes in the second stage 220. Advantageously, coupling the high impedance nodes may improve the stability of the first amplifier stages when they are connected in parallel.

Figure 11:
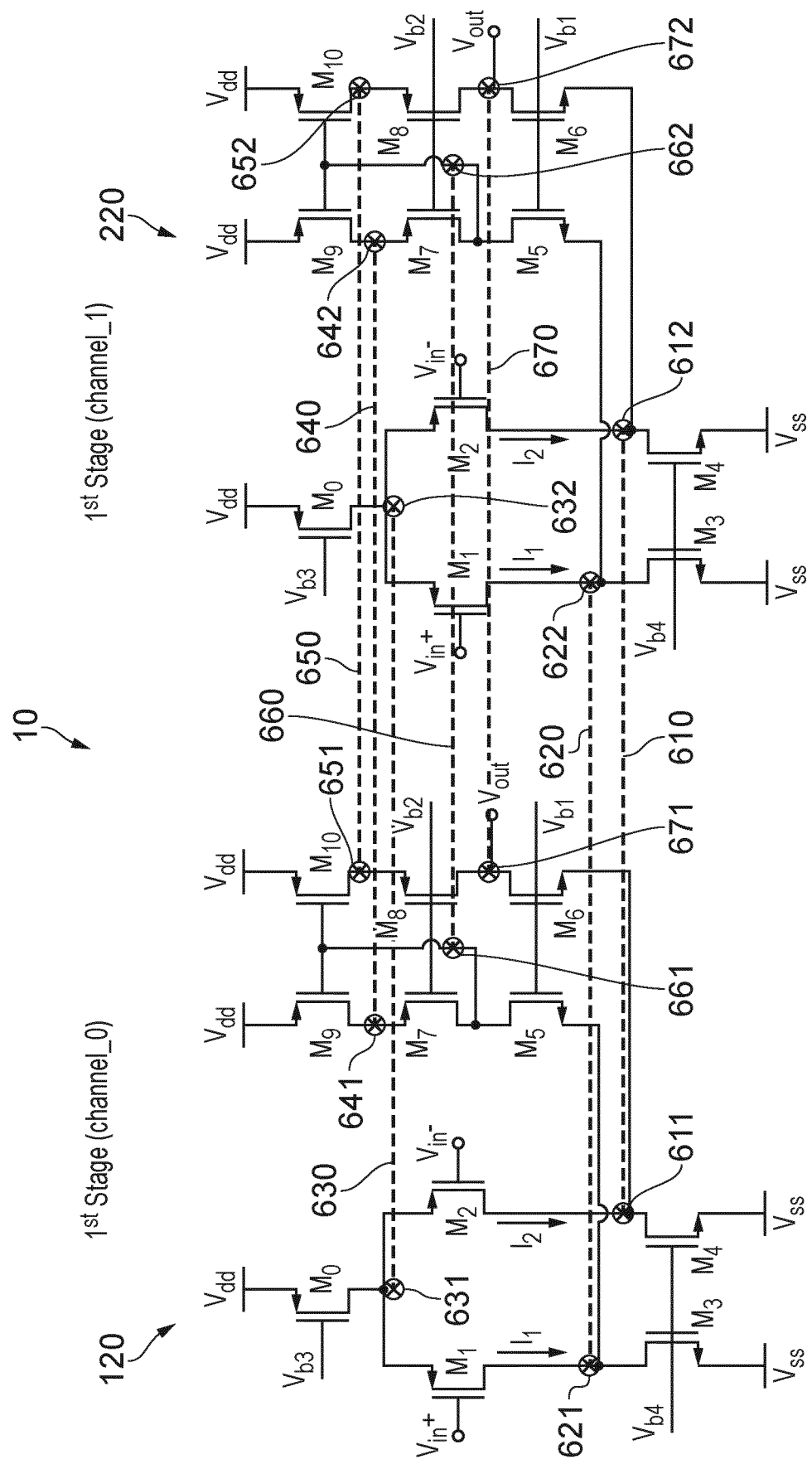
FIG. 11 shows an example circuit schematic of the first amplifier stages of the present disclosure.

FIG. 11 illustrates an example of how the first stage 120 of the first channel 100 and the first stage 220 of the second channel may be implemented with short circuit connections between high impedance nodes. As illustrated in FIG. 11, the first stage 120 of the first channel 100 can be implemented as a folded cascode op-amp architecture.

The first stage 120 comprises MOS transistors M0, M1, M2, M3, M4, M5, M6, M7, M8, M9, M10. The transistors M0, M1, M2, M7, M8, M9 and M10 are PMOS transistors. The transistors M3, M4, M5, M6 are NMOS transistors. Each of the transistors have a source, a gate and a drain terminal. The source of M0 is coupled to an upper power supply rail Vdd. The gate of M0 is coupled to a bias or reference voltage Vb3. The drain of M0 is coupled to the sources of both M1 and M2. The gate of M1 is a first input Vin+ to the first stage 120. The gate of M2 is a second input Vin− to the first stage 120. The inputs Vin+ and Vin− together form a differential input to the first stage 120. Therefore, in this implementation, the inputs Vin+ and Vin− together form the input to the first stage 120 as illustrated in FIGS. 1 to 10. The drain of M1 is coupled to the drain of M3. The source of M3 is coupled to a lower power supply rail Vss. The gate of M3 is coupled to a bias or reference voltage Vb4. The drain of M2 is coupled to the drain of M4. The source of M4 is also coupled to the lower power supply rail Vss. The gate of M4 is coupled to the gate of M3, and therefore to the same bias voltage Vb4.

The source of M5 is coupled to the drain of M1. The gate of M5 is coupled to a bias or reference voltage Vb1. The drain of M7 is coupled to the drain of M5. The gate of M7 is coupled to a bias or reference voltage Vb2. The drain of M9 is coupled to the source of M7. The source of M9 is coupled to the upper power supply rail Vdd. The gate of M9 is coupled to the drain of M7. The source of M6 is coupled to the drain of M2. The gate of M6 is coupled to the gate of M5 and therefore to the same reference voltage Vb1. The drain of M8 is coupled to the drain of M6. The gate of M8 is coupled to the gate of M7, and therefore to the same reference voltage Vb2. The drain of M10 is coupled to the source of M8. The source of M10 is coupled to the upper power supply rail Vdd. The gate of M10 is coupled to the gate of M9, and therefore is also coupled to the drain of M7. The drain of M8 (also the drain of M6) forms the output Vout of the first stage 120.

The following nodes in the first stage 120 may have a relatively high impedance: drain of M0; drain of M1, drain of M2, drain of M6, drain of M5, drain of M9 and drain of M10. In the example of FIG. 11, the first stage 220 of the second channel 200 has the same architecture as the first stage 120 of the first channel 100 with the same high impedance nodes. Therefore, the description of the first stage 220 will not be repeated.

Short circuit connections can be provided between corresponding high impedance nodes of the first stages 120 and 220 using conductive paths 610, 620, 630, 640, 650, 660, 670. The path 610 is coupled to the drain of M4 in the first stage 120 via a switch 611, and the drain of M4 in the first stage 220 via a switch 612. The path 620 is coupled to the drain of M1 in the first stage 120 via a switch 621 and to the drain of M1 in the second stage 220 via a switch 622. The path 630 is coupled to the drain of M0 in the first stage 120 via a switch 631 and the drain M0 in the first stage 220 via a switch 632. The path 640 is coupled to the drain of M9 in the first stage 110 via a switch 641 and to the drain of M9 in the first stage 220 via a switch 642. The path 650 is coupled to the drain of M10 in the first stage 120 via a switch 651 and to the drain of M10 in the first stage 220 via a switch 652. The path 660 is coupled to the drain of M7 in the first stage 120 via a switch 661 and to the drain of M7 in the first stage 220 via a switch 662. The path 670 is coupled to the drain of M6 of the first stage 120 via a switch 671 and to the drain of M6 of the first stage 220 via a switch 672.

As such, when the integrated circuit 10 is put into a state where the first stages 120 and 220 are connected in parallel (e.g. as in FIGS. 5, 6, 8, 9 and 10), each of the switches 611, 612, 621, 622, 631, 632, 641, 642, 651, 652, 661, 662, 671, 672 may also close such that corresponding high impedance nodes within the first stages 120 and 220 are short circuited.

Figure 12:
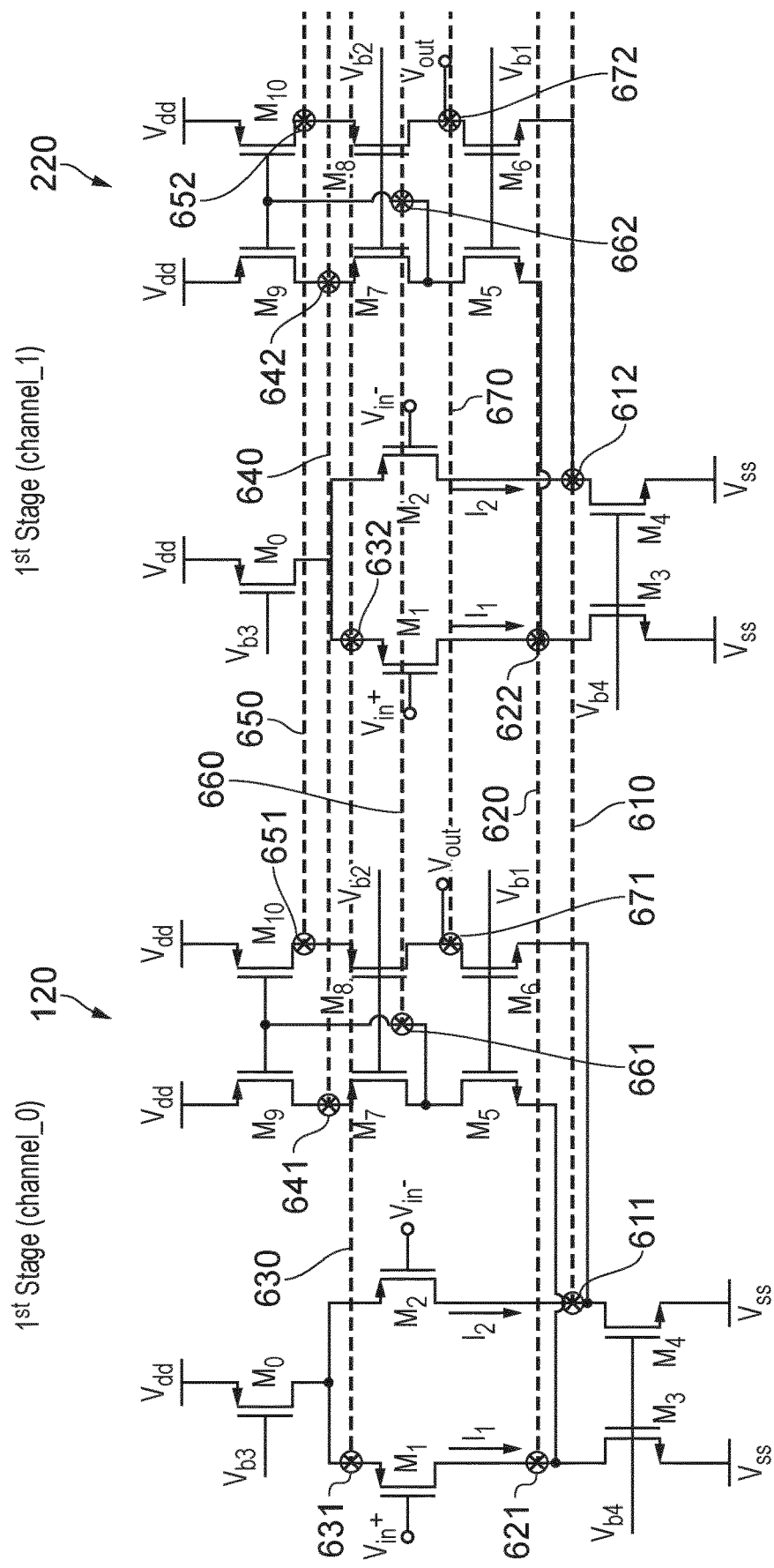
FIG. 12 shows another example circuit schematic of the first amplifier stages of the present disclosure.
Figure 12:
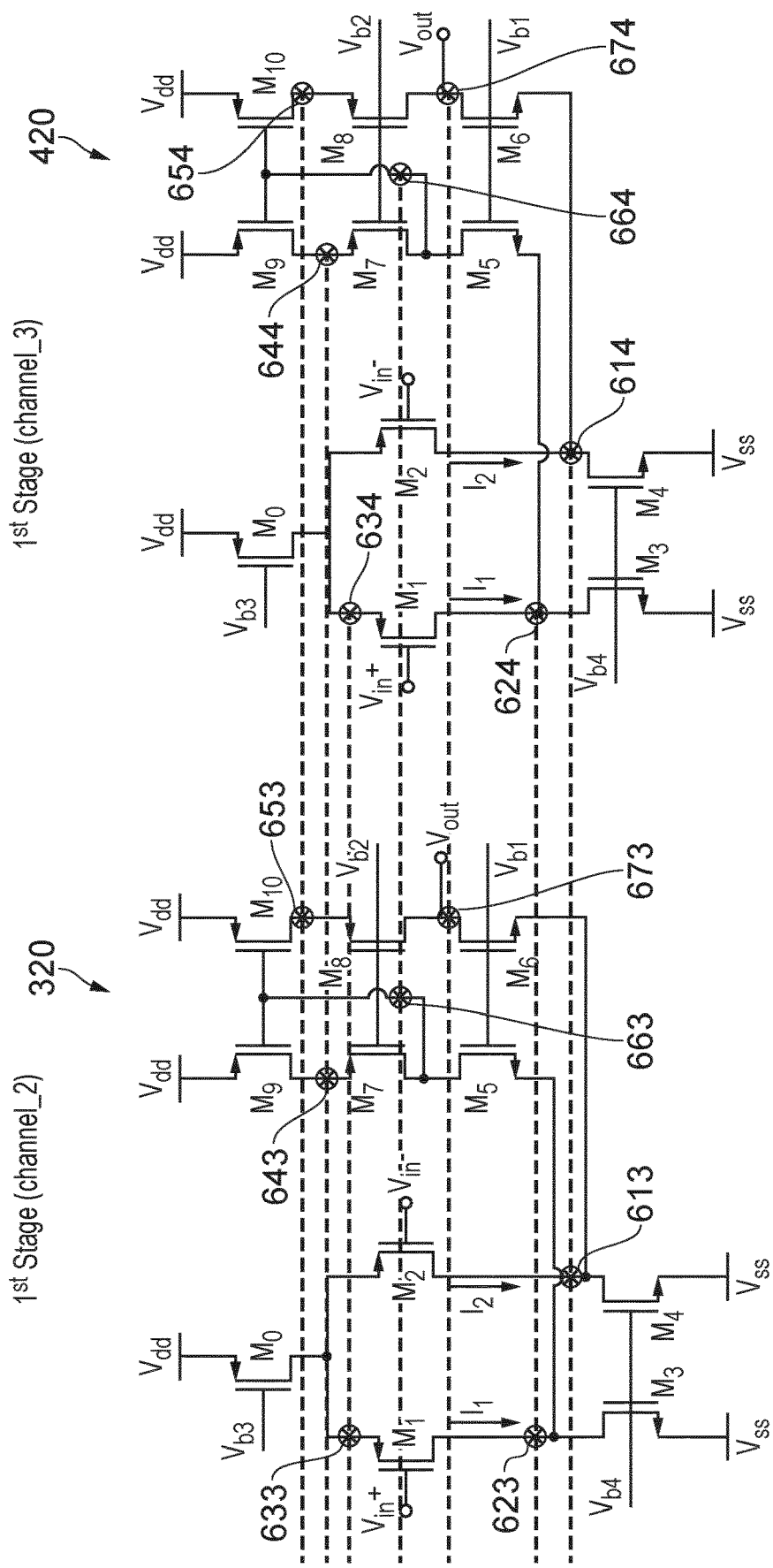

When all four first stages 120, 220, 320 and 420 are to be placed in parallel (e.g. as in FIG. 6), the arrangement shown in FIG. 11 can be extended across all four first stages. With reference to FIG. 12, the first stage 320 of the third channel 300 and the first stage 420 of the fourth channel 400 can have the same op-amp architecture as the first stages 120 and 220. As such, the integrated circuit 10 can include further switches such that the corresponding high-impedance nodes across all four can be short circuited. In particular, the switches 613 and 614 are provided to couple the drains of the M4 in the first stages 320 and 420 to the path 610. The switches 623 and 624 are provided to couple the drains of M1 in the first stages 320 and 420 to the path 620. The switches 633 and 634 are provided to couple the drains of M0 in the first stages 320 and 420 to the path 630. The switches 643 and 644 are provided to couple the drains of M9 in the first stages 320 and 420 to the path 640. The switches 653 and 654 are provided to couple the drains of M10 in the first stages 320 and 420 to the path 650. The switches 663 and 664 are provided to couple the drains of M7 in the first stages 320 and 420 to the path 660. The switches 673 and 674 are provided to couple the drains of M6 in the first stages 320 and 420 to the path 670.

Advantageously, when each of the first stages 120, 220, 320, 420 are to be connected in parallel (e.g. as in FIG. 6), the high impedance nodes within each first stage can also be short circuited by also closing the switches 613, 623, 633, 643, 653, 663, 673, 614, 624, 634, 644, 654, 664, 674.

It will be appreciated that the integrated circuit 10 can include additional switches or circuitry to accommodate for when the first stages 120/220, and 320/420 are to be connected separately in parallel (e.g. as in FIG. 5). For example, the integrated circuit can include a series switch in each path 610-670 in between the first stage 220 and the third stage 320. In a closed state, said series switches will allow for the high impedance nodes across all four first stages to be short circuited. In an open state, said series switches will provide separation between the pair of first stages 120 and 220, and the pair of first stages 320 and 420, as required in the mode shown in FIG. 5. In particular, this allows for the corresponding high impedance nodes between the first stages 120 and 220 to be short circuited, without being short circuited with the corresponding high impedance nodes in the first stages 320 and 420. Moreover, this also allows for the corresponding high impedance nodes between the first stages 320 and 420 to be short circuited, without being short circuited with the corresponding high impedance nodes in the first stages 120 and 220. However, any alternative arrangement of switches can be used to couple high impedance nodes between the first stages 120, 220, 320, 420, provided that the functionality described in respect of FIGS. 1 to 10 is achieved.

Figure 16:
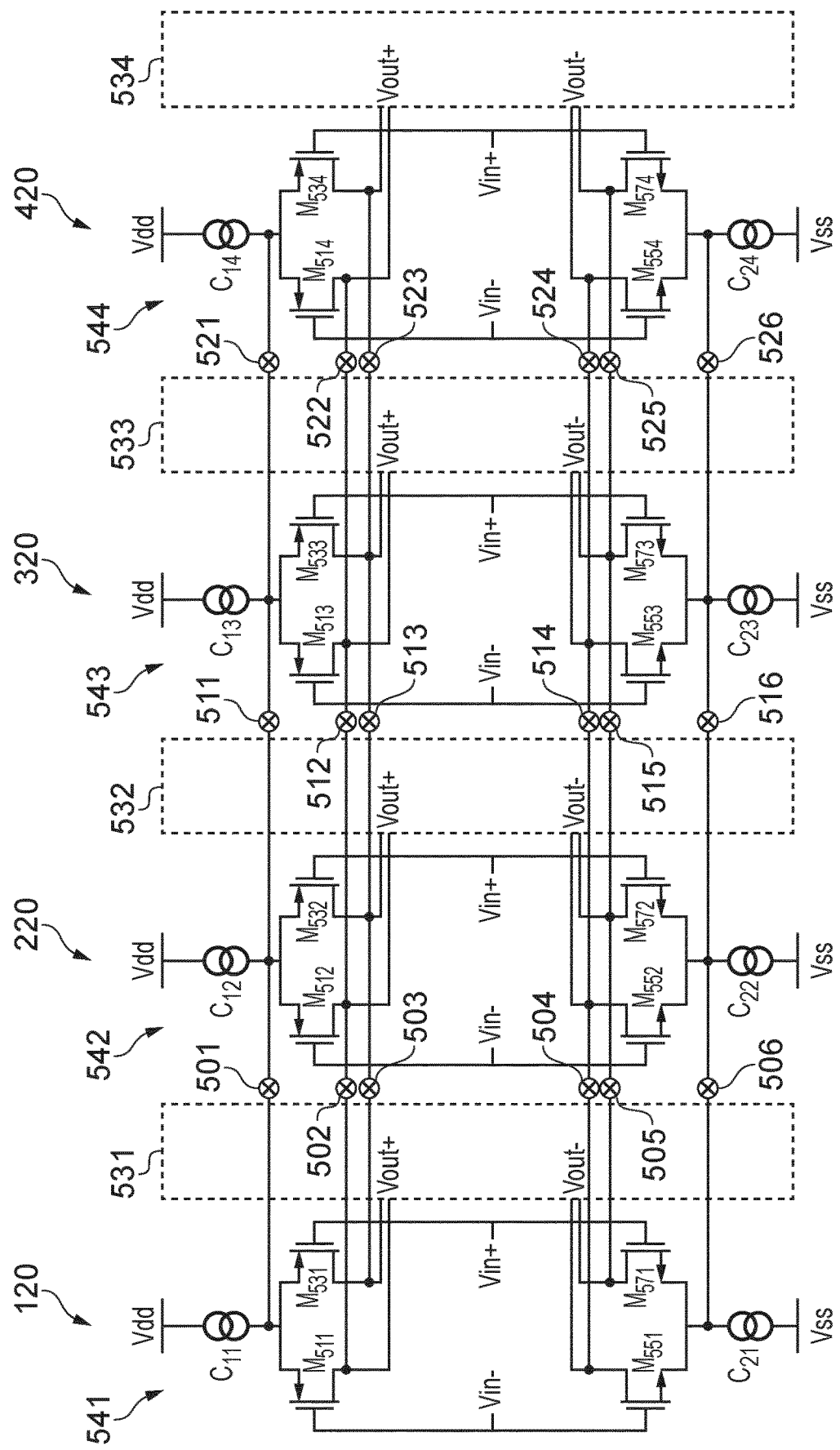
FIG. 16 shows another example circuit schematic of the first amplifier stages of the present disclosure.

FIG. 16 illustrates another example implementation of the first amplifier stages 120, 220, 320 and 420 of the integrated circuit 10. In the example of FIG. 16, the first amplifier stage 120 includes a rail-to-rail input stage 541. Similarly, the first amplifier stages 220, 320 and 420 include respective rail-to-rail input stages 542, 543, 544. The integrated circuit 10 also comprises switches 501-506, 511-516 and 521-526.

The first stage 120 comprises MOS transistors M511, M531, M551 and M571. The first stage 120 also includes a first current source C11 and a second current source C21. The current sources C11 and C21, and the transistors M511, M531, M551 and M571 together form a rail-to-rail input stage of the first amplifier stage 120.

The transistors M511 and M531 are PMOS transistors. The transistors M551 and M571 are NMOS transistors. Each of the transistors M511, M531, M551 and M571 have a source, a gate and a drain terminal. A first side of the current source C11 is coupled to an upper power supply rail Vdd. A second side of the current source C11 is coupled to the source of M511 and the source of M531. The gate of M511 is coupled to a first input Vin− to the first stage 120. The gate of M531 is coupled to a second input Vin+ to the first stage 120. The drains of M511 and M531 together form a first differential output Vout+ of the rail-to-rail input stage. A first side of the current source C21 is coupled to a lower power supply rail Vss. A second side of the current source C21 is coupled to the source of M551 and the source of M571. The gate of M551 is coupled to the first input Vin− to the first stage 120. The gate of M571 is coupled to the second input Vin+ to the first stage 120. The drains of M551 and M571 together form a second differential output Vout− of the rail-to-rail input stage. The block 531 can represent additional internal stages of the first amplifier stage 120 cascaded in between the rail-to-rail input stage 541 and the output of the first amplifier stage 120. For example, the block 531 can include additional circuitry that forms an opamp (e.g. a single stage opamp, a full cascode opamp or otherwise) with the rail-to-rail input stage 541. However, the block 531 can be optional.

The following nodes of the rail-to-rail input stage 541 may have a relatively high impedance: second side of current source C11, second side of current source C21, and the drains of each of M511, M531, M551 and M571. The rail-to-rail input stages 542, 543, 544 have substantially the same architecture to the rail-to-rail input stage 541 as indicated by the like reference signs, and therefore the description of those stages is not repeated. Moreover, the rail-to-rail input stages 542, 543, 544 have corresponding high impedance nodes to the rail-to-rail input stage 541.

Short circuit connections are provided between corresponding high impedance nodes between the rail-to-rail input stages 541, 542, 543, 544. The second sides of the current sources C11 and C12 are coupled via a switch 501. The second sides of the current sources C12 and C13 are coupled via the switch 511. The second sides of the current sources C13 and C14 are coupled via the switch 521. The drains of M511 and M512 are coupled via the switch 502. The drains of M512 and M513 are coupled via the switch 512. The drains of M513 and M514 are coupled via the switch 522. The drains of M531 and M532 are coupled via the switch 503. The drains of M532 and M533 are coupled via the switch 513. The drains of M533 and M534 are coupled via the switch 523. The drains of M551 and M552 are coupled via the switch 504. The drains of M552 and M553 are coupled via the switch 514. The drains of M553 and M554 are coupled via the switch 524. The drains of M571 and M572 are coupled via the switch 505. The drains of M572 and M573 are coupled via the switch 515. The drains of M573 and M574 are coupled via the switch 525. The second sides of the current sources C21 and C22 are coupled via a switch 506. The second sides of the current sources C22 and C23 are coupled via the switch 516. The second sides of the current sources C23 and C24 are coupled via the switch 526.

When the integrated circuit 10 is put into a state where the first stages 120 and 220 are to be connected in parallel (e.g. as in FIGS. 5, 8, 9, and 10), each of the switches 501, 502, 503, 504, 505 and 506 may also close such that corresponding high impedance nodes within the rail-to-rail stages 541 and 542 are short circuited. Similarly, when the first stages 320 and 420 are to be connected in parallel, each of the switches 521, 522, 523, 524, 525, 526 may also close such that corresponding high impedance nodes within the rail-to-rail stages 543 and 544 are short circuited. When all four of the first amplifier stages 120, 220, 320 and 420 are to be placed in parallel (e.g. as in FIG. 6), the switches 511, 512, 513, 514, 515 and 516 can further be closed so that the corresponding high impedance nodes across the rail-to-rail stages 541, 542, 543, 544 are short circuited. Although not shown, corresponding high impedance nodes in the additional blocks 531, 532, 533, 544 can also be short circuited accordingly using similar techniques.

Figure 17A:
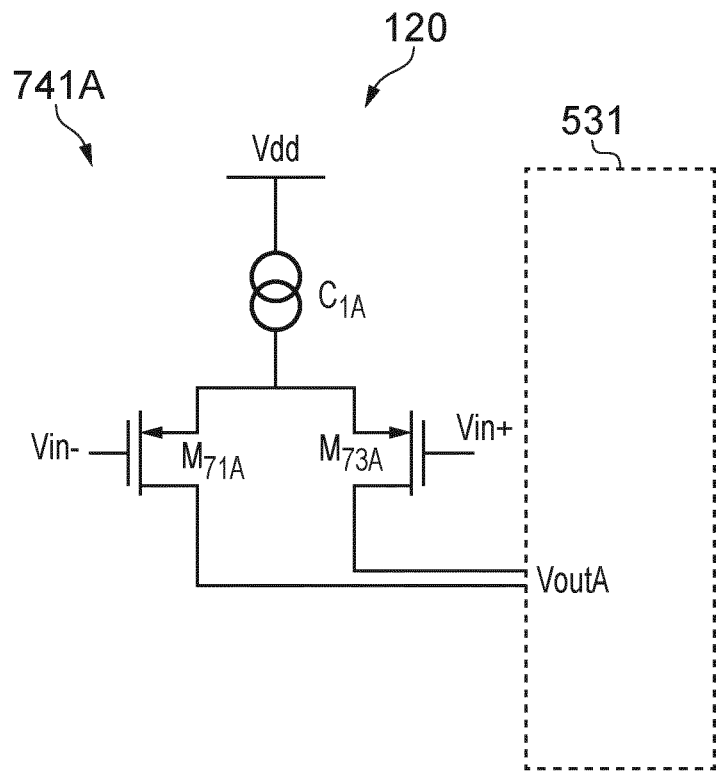
FIGS. 17A-17D show examples of input stages of the first amplifier stages of the present disclosure.

It will be appreciated that the first stages 120, 220, 320 and 420 can include any other type of input stage in place of the rail-to-rail input stages 541, 542, 543, 544. FIG. 17A illustrates an example of another input stage 741A of the first amplifier stage 120. The input stage 741A includes a current source C1A, and PMOS transistors M71A and M73A. A first side of the current source C1A is coupled to an upper supply rail Vdd. A second side of the current source C1A is coupled to the sources of M71A and M73A. The gate of M71A is coupled to a first input Vin− to the first amplifier stage 120. The gate of M73A is coupled to a second input Vin+ to the first amplifier stage 120. The drains of M71A and M73A form an output VoutA of the input stage 741A.

Figure 17B:
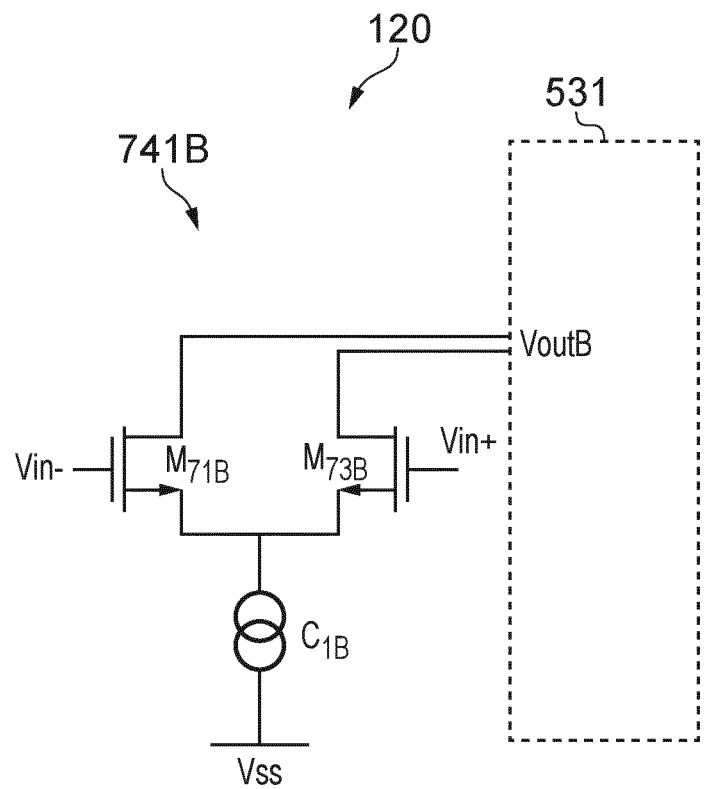

FIG. 17B illustrates another example of an input stage 741B of the first amplifier stage 120. The input stage 741B includes a current source C1B, and NMOS transistors M71B and M73B. A first side of the current source C1B is coupled to a lower supply rail Vss. A second side of the current source C1B is coupled to the sources of M71B and M73B. The gate of M71B is coupled to a first input Vin− to the first amplifier stage 120. The gate of M73B is coupled to a second input Vin+ to the first amplifier stage 120. The drains of M71B and M73B form an output VoutB of the input stage 741B.

Figure 17C:
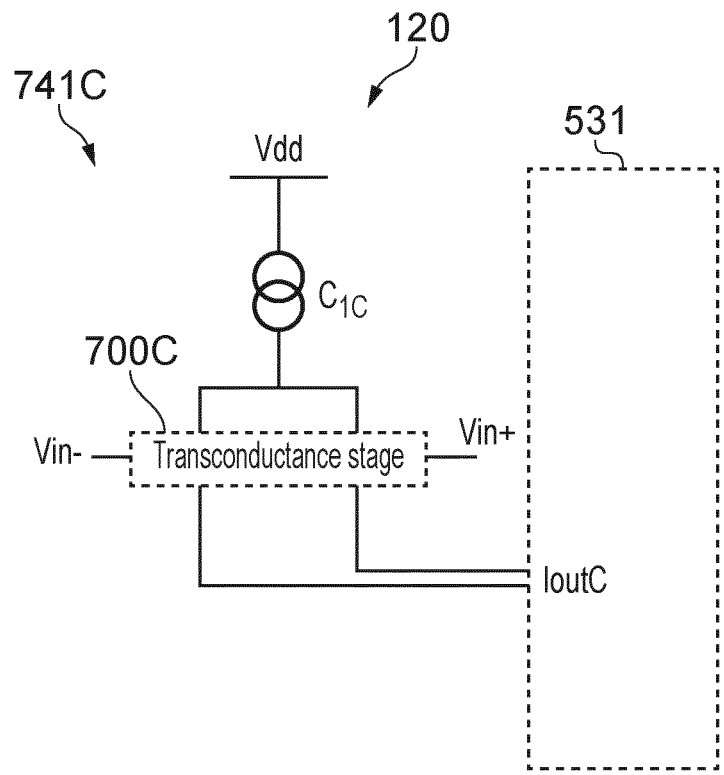

FIG. 17C illustrates another example of an input stage 741C or the first amplifier stage 120. The input stage 741C includes a current source C1C and a transconductance stage 700C. A first side of the current source C1C is coupled to an upper supply rail Vdd. A second side of the current source C1C is coupled to the transconductance stage 700C to supply current to the transconductance stage 700C. The transconductance stage 700C receives a first input Vin− to the first amplifier stage 120 and a second input Vin− to the first amplifier stage 120. The transconductance stage 700C converts the voltage input Vin−/Vin+ to a current output IoutC. Any transconductance stage known in the art can be used as the transconductance stage 700C.

Figure 17D:
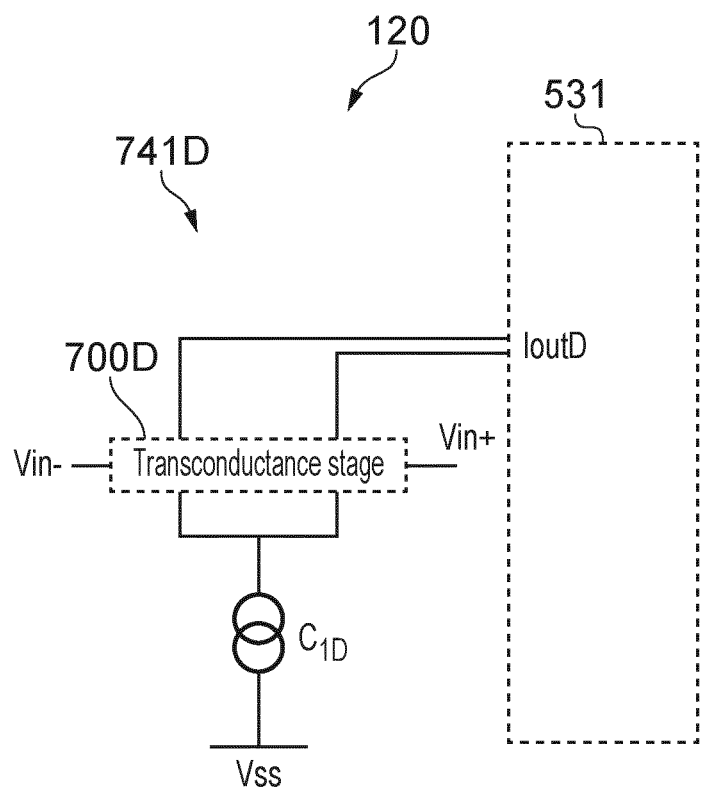

FIG. 17D illustrates another example of an input stage 741D of the first amplifier stage 120. The input stage 741D is similar to the input stage 741C. The input stage 741D differs in that the current source C1D is coupled between a lower supply rail Vss and the transconductance stage 700D.

It will be appreciated that in each of the examples of FIGS. 17A-17D, the first amplifier stages 220, 320 and 420 may have substantially the same input stages to the first amplifier stage 120.

It will be appreciated that the above examples are one set of possible implementations for the first amplifier stages. Architectures other than those illustrated may be used. Furthermore, different arrangements of switches can be used, provided it is possible to provide short circuits between the relevant locations between the first stages, i.e. between corresponding high impedance nodes, when two or more of the first amplifier stages are to operate in parallel, as required in any of FIGS. 1 to 10 or otherwise. For example, FIGS. 12 and 16 show how different switch arrangements can be used between the high-impedance nodes.

It will be appreciated that not all high impedance nodes between the first stages need to be coupled in order to observe improvements in stability. Rather it is sufficient to couple any one or more corresponding high impedance nodes between the first amplifier stages. Coupling the high impedance nodes may introduce parasitic capacitances to the circuit (e.g. due to the use of additional switches in the circuit). As such, any one or more of the high impedance nodes can be coupled when the first stages are operated in parallel, to strike a balance between stability and the parasitics introduced.

It has been described above how that the first amplifier stages can be powered down when not in use. For example, in FIG. 3, FIG. 4, and FIG. 7, the first stage 220 of the second channel 200 and the first stage 320 of the third channel 300 can be powered down to save power. With reference to the example implementation of FIG. 12, the first stage 220 can include a pull up circuit at the bias node Vb3 (gate of M0), a pull up circuit at the bias node Vb2 (gate of M7) and a pull down circuit at the bias node Vb4 (gate of M3 and M4). When the first stage 220 is to be powered down, the pull up and pull down circuits can be activated to cause the output of the first stage 220 (Vout, drain of M8) to float. The first stages 120, 320, 420 can include corresponding pull up and pull down circuits so that they can also be powered down when desired by the user.

Each of the pull-up circuits can include a switch. In particular, the pull-up circuit at the bias node Vb3 can include a switch coupled between Vb3 and Vdd. The pull-up circuit at the bias node Vb2 can include a switch coupled between Vb2 and Vdd. Furthermore, the pull-down circuit can also include a switch. In particular, the pull-down circuit at the bias node Vb4 can include a switch coupled between Vb4 and Vss. When the first stage is to be powered down, each of the pull-up and pull-down switches are closed. Consequently, the bias nodes Vb3 and Vb2 are pulled up to Vdd. The bias node Vb4 is pulled down to Vss. Therefore, the output of the first stage Vout will float.

Preferably, the switches in the pull-up circuits are PMOS switches. For example, the pull-up circuit at the bias node Vb3 can be a PMOS switch coupled between Vb3 and Vdd. A source of the PMOS switch can be coupled to Vdd and a drain of the PMOS switch can be coupled to Vb3. Similarly, the pull-up circuit at the bias node Vb2 can be a PMOS switch coupled between Vb2 and Vdd. For example, a source of the PMOS switch can be coupled to Vdd and a drain of the PMOS switch can be coupled to Vb2. Preferably, the pull-down circuit can be a NMOS switch. In particular, the pull-down circuit at the bias node Vb4 can be a NMOS switch coupled between Vb4 and Vss. A source of the NMOS switch can be coupled to Vss and a drain of the NMOS switch can be coupled to Vb4. The state of the PMOS and NMOS switches (i.e. open or closed) can be controlled with a suitable control signal to the gates of said switches.

It will be appreciated that similar pull-up and pull-down circuitry can be used in the example implementations of FIGS. 16 and 17A-17D, or other implementations of the first amplifier stages, to power down the first amplifier stages.

Second Amplifier Stage

Figure 13:
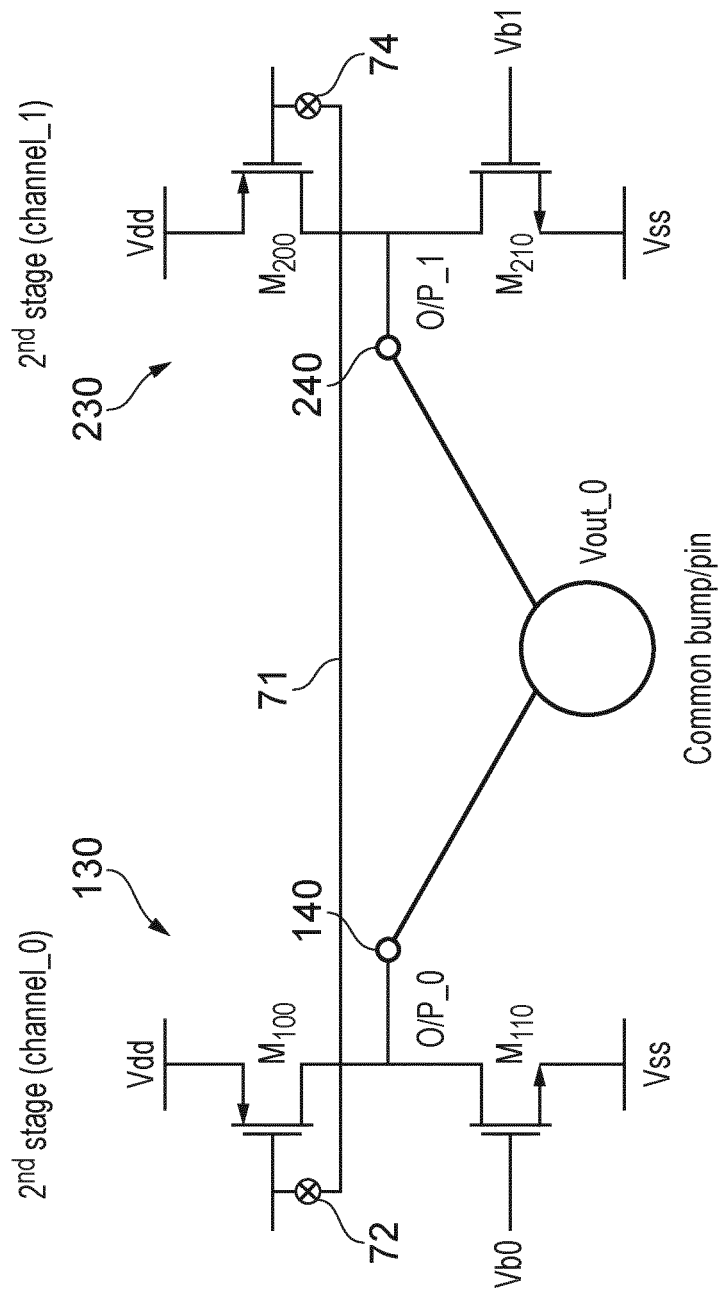
FIG. 13 shows an example circuit schematic of second amplifier stages of the present disclosure.

With reference to FIG. 3, it was described how the second stage 130 of the first channel 100 and the second stage 230 of the second channel 200 can be connected to operate in parallel. In particular, the inputs to the first stages 120 and 220 are short circuited via the switch 70 and the outputs can be short circuited by the user at the output terminals 140 and 240. FIG. 13 illustrates an example implementation of the second stages 130 and 230, and of the switch 70.

As shown in FIG. 13, the second stage 130 can be implemented as a class A amplifier. The second stage 130 comprises MOS transistors M100 and M110. The transistor M100 is a PMOS transistor, and the transistor M110 is a NMOS transistor. Each of the transistors M100 and M110 have a source, a drain and a gate. The source of M100 is coupled to the upper power supply voltage Vdd. The gate of M100 forms the input to the second stage 130. The drain of M100 is coupled to the drain of M110. The source of M110 is coupled to the lower power supply voltage Vss. The gate of M110 is coupled to a bias or reference voltage Vb0. The node at the drains of the transistors M100 and M110 forms the output of the second stage 130.

The second stage 230 of the second channel 200 may also be substantially identical to the second stage 130 of the first channel 100. In particular, the second stage 230 is also a class A amplifier. The second stage 230 comprises MOS transistors M200 and M210. The transistor M200 is a PMOS transistor, and the transistor M210 is a NMOS transistor. Each of the transistors M200 and M210 have a source, a drain and a gate. The source of M200 is coupled to the upper power supply voltage Vdd. The gate of M200 forms the input to the second stage 230. The drain of M200 is coupled to the drain of M210. The source of M210 is coupled to the lower power supply voltage Vss. The gate of M210 is coupled to a bias or reference voltage Vb1. The node at the drains of the transistors M200 and M210 forms the output of the second stage 230.

The switch 70 shown in FIG. 1 can be implemented with a conductive path 71, and two switches 72 and 74. The conductive path 71 is coupled to the gate of the transistor M100 (i.e. the input to the second stage 130) via the switch 72. The conductive path 71 is also coupled to the gate of the transistor 200 (i.e. the input to the second stage 230) via the switch 74.

As such, when the switches 72 and 74 are closed, a short circuit is provided between the gates of the transistors M100 and M200. Therefore the inputs to the second stages 130 and 230 can be short circuited e.g. as required in the modes illustrated in FIGS. 3, 4, 5, 6 and 10. Otherwise, the switches 72 and 74 can remain open such that the inputs to the second stages 130 and 230 remain open circuit, as required in the other modes.

Figure 14:
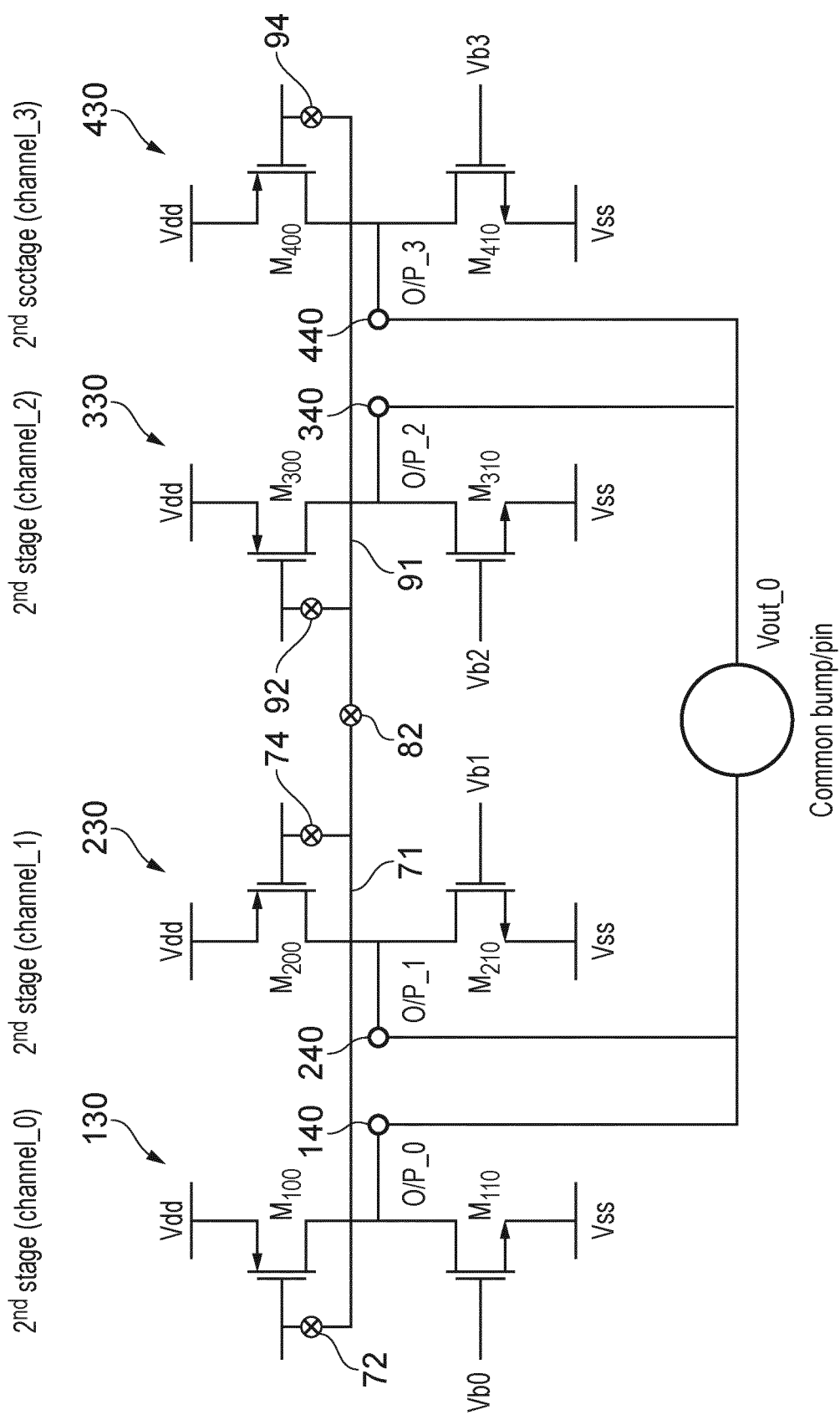
FIG. 14 shows another example circuit schematic of second amplifier stages of the present disclosure.

It will be appreciated that the second stage 330 of the third channel 30, the second stage 430 of the fourth channel 400 and the switch 90 between the inputs of the second stages 330 and 430 can be implemented in a similar way. As shown in FIG. 14, the second stage 330 of the third channel 300 and the second stage 430 of the fourth channel 400 can have the same architecture as the second stages 130 and 230. In particular, the second stages 330 and 430 can both be class A amplifiers.

The second stage 330 comprises MOS transistors M300 and M310. The transistor M300 is a PMOS transistor, and the transistor M310 is a NMOS transistor. Each of the transistors M300 and M310 have a source, a drain and a gate. The source of M300 is coupled to the upper power supply voltage Vdd. The gate of M300 forms the input to the second stage 330. The drain of M300 is coupled to the drain of M310. The source of M310 is coupled to the lower power supply voltage Vss. The gate of M310 is coupled to a bias or reference voltage Vb2. The node at the drains of the transistors M300 and M310 forms the output of the second stage 330.

The second stage 430 comprises MOS transistors M400 and M410. The transistor M400 is a PMOS transistor, and the transistor M410 is a NMOS transistor. Each of the transistors M400 and M410 have a source, a drain and a gate. The source of M400 is coupled to the upper power supply voltage Vdd. The gate of M400 forms the input to the second stage 430. The drain of M400 is coupled to the drain of M410. The source of M410 is coupled to the lower power supply voltage Vss. The gate of M410 is coupled to a bias or reference voltage Vb3. The node at the drains of the transistors M400 and M410 forms the output of the second stage 430.

The switch 90 shown in FIG. 1 can be implemented with a conductive path 91, and two switches 92 and 94. The conductive path 91 is coupled to the gate of the transistor M300 (i.e. the input to the second stage 330) via the switch 92. The conductive path 91 is also coupled to the gate of the transistor 400 (i.e. the input to the second stage 430) via the switch 94.

As such, when the switches 92 and 94 are closed, a short circuit is provided between the gates of the transistors M300 and M400. Therefore the inputs to the second stages 330 and 430 can be short circuited e.g. as required in the modes illustrated in FIGS. 3, 4, 5, 6 and 10. Otherwise, the switches 72 and 74 can remain open such that the inputs to the second stages 130 and 230 remain open circuit, as required in the other modes.

FIG. 14 also illustrates how the switch 80 in FIG. 1 may be implemented. In particular, a switch 82 is provided in series between the conductive paths 71 and 91. Therefore, when all second stages 230 and 330 are to be placed in parallel (e.g. as in FIG. 6), the switches 82, 74 and 92 can be closed in order to provide a short circuit between the inputs of the second stages 230 and 330. Moreover, the switches 72 and 94 can also be closed so that the short circuit is extended to the inputs to the second stages 130 and 430, as shown in FIG. 6.

It will be appreciated that FIGS. 13 and 14 show one set of possible implementations for the second stages. Architectures other than illustrated may be used, such as class B or class AB architectures. Furthermore, different arrangements of switches can be used, provided it is possible to provide short circuits between the inputs of the second stages as described in relation to FIGS. 1 to 10 or otherwise.

Interpolation DAC

In some examples, the DAC channels 100, 200, 300, 400 can be implemented as interpolation DACs. Advantageously, interpolation DACs can offer further space savings on-chip.

Figure 19:
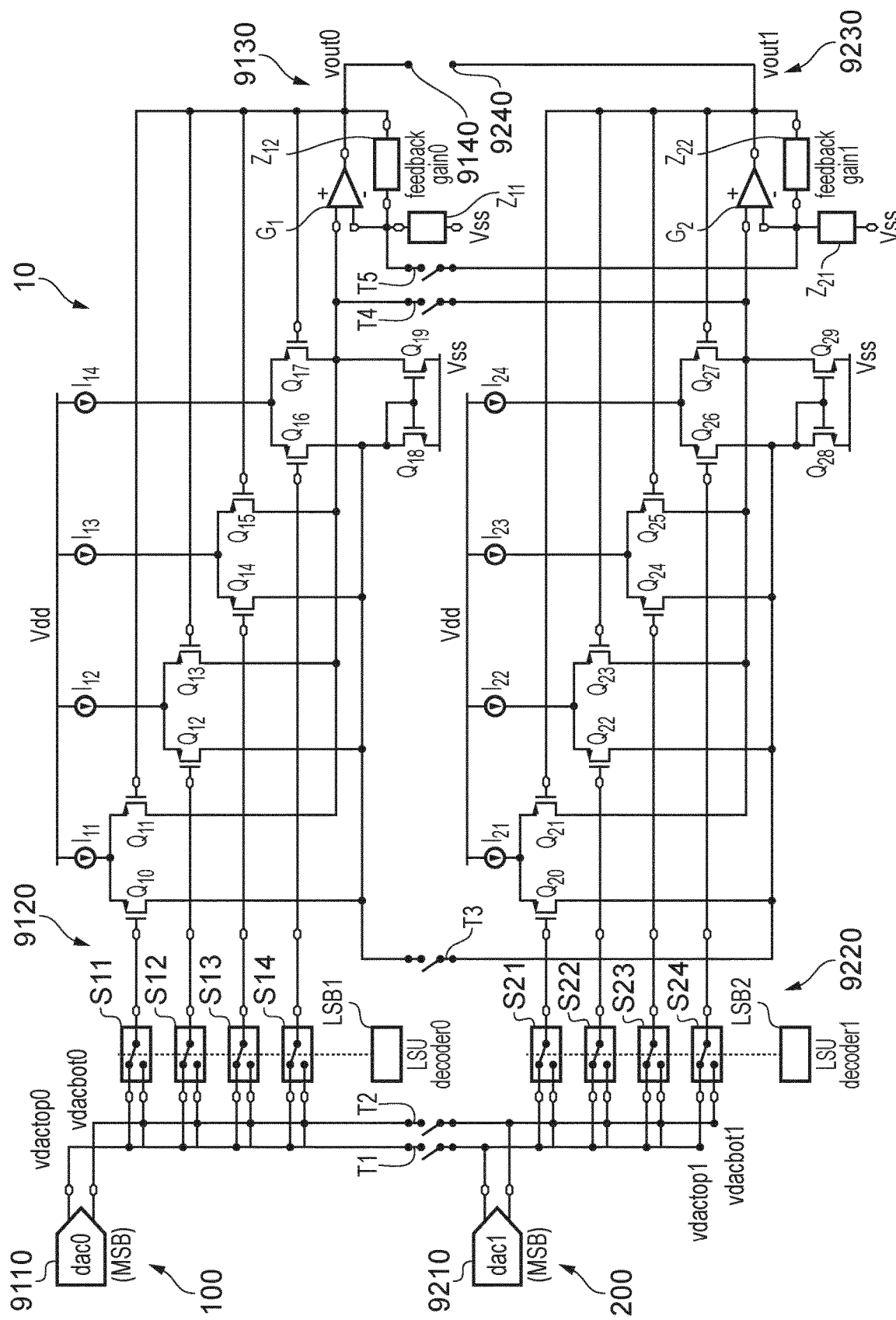
FIG. 19 shows an example circuit schematic of DAC channels of the present disclosure.

Reference is made to FIG. 19, which illustrates an example of how the DAC channels 100 and 200 can be implemented as interpolation DACs. The first channel 100 includes a MSB (most-significant bit) DAC 9110, an interpolation circuit 9120, and an output stage 9130. These may be considered as sub-stages of the interpolation DAC. The output stage 9130 can be considered as part of the interpolation circuit 9120. The MSB DAC 9110 receives an MSB portion of the respective digital input D0. The MSB DAC 9110 outputs voltages vdactop0 and vdacbot0 based on the MSB portion of D0. The values of vdactop0 and vdacbot0 will depend on the value of the MSB portion of D0. For example, the MSB DAC 9110 can be a string DAC, including a string of resistors coupled in series between an upper supply voltage (e.g. Vdd) and a lower supply voltage (e.g. Vss). The voltages vdactop0 and vdacbot0 correspond to the voltages on either side of a resistor, the resistor being selected based on the MSB portion of D0.

The interpolation circuit 9120 includes switches S11-S14, transistors Q10-Q19 and current sources I11-I14. Each of the transistors Q10-Q17 are illustrated as PMOS devices, and the transistors Q18-Q19 are illustrated as NMOS devices. However, it will be appreciated that an equivalent circuit using NMOS devices for Q10-Q17 and PMOS devices for Q18-Q19 can be implemented. The switch S11 is arranged to couple the gate of Q10 to vdactop0 or vdacbot0. The switch 512 is arranged to couple the gate of Q12 to vdactop0 or vdacbot0. The switch 513 is arranged to couple the gate of Q14 to vdactop0 or vdacbot0. The switch 514 is arranged to couple the gate of Q16 to vdactop0 or vdacbot0. The states of the switches S11-S14 (i.e. whether they connect the gate of the respective transistor to vdactop0 or vdacbot0) are controlled by a LSB (least significant bit) decoder LSB1. The sources of Q10 and Q11 are coupled to the upper supply rail Vdd via the current source I11. The sources of Q12 and Q13 are coupled to the upper supply rail Vdd via the current source I12. The sources of Q14 and Q15 are coupled to the upper supply rail Vdd via the current source I13. The sources of Q16 and Q17 are coupled to the upper supply rail Vdd via the current source I14. The sources of Q18 and Q19 are coupled to the lower supply rail Vss. The gate of Q18 is coupled to the gate of Q19 and the drain of Q18. The drains of Q10, Q12, Q14 and Q16 are also coupled to the drain of Q18.

The output stage 9130 includes an amplifier G1, and feedback impedances Z11 and Z12. The drains of Q11, Q13, Q15 and Q17 are coupled to a positive (non-inverting) input to the amplifier G1. The gates of Q11, Q13, Q15 and Q17 are coupled to the output of G1. The feedback impedance Z11 is coupled between the negative (inverting) input of G1 and the lower supply rail Vss. The feedback impedance Z12 is coupled between the negative input of G1 and the output of G1.

In operation, the MSB DAC 9110 outputs the voltages vdactop0 and vdacbot0 based on the MSBs of D0. The switches S11, S12, S13 and S14 couple the gates of Q10, Q12, Q13 and Q14 to either vdactop0 or vdacbot0, based on the LSBs of D0. The switches S11-S14 operate incrementally based on the LSBs of D0. For example, when the LSBs are at their lowest (all "0"), the switches S11-S14 may couple all of the gates to vdacbot0. As the LSB word increments, the switches S11-S14 may incrementally switch the respective gates to vdactop0 instead of vdacbot0. The remainder of the interpolation circuit 9120, in combination with the output stage 9130, acts to average the output of the switches S11-S14. The average is outputted at the output 9140 of the channel 100 as an output signal vout0. It will be appreciated that the operation and functionality of interpolation DACs are known in the art, and therefore the operating principles of the interpolation DAC is not described in detail.

Referring to the second channel 200, the second channel 200 also includes a MSB DAC 9210, an interpolation circuit 9220 and an output stage 9230. The architecture and functionality of the second channel 200 is substantially similar to the first channel 100, and therefore its description is not repeated. The similarities can be identified from FIG. 19 by the like reference signs.

As shown in FIG. 19, the integrated circuit 10 further includes switches T1, T2, T3, T4 and T5. The switch T1 is coupled between the output vdactop0 of the MSB DAC 9110 of the first channel 100 and the output vdactop1 of the MSB DAC 9220 of the second channel 200. The switch T2 is coupled between the output vdacbot0 of the MSB DAC 9110 of the first channel 100 and the output vdacbot1 of the MSB DAC 9220 of the second channel 200. The switch T3 is coupled between the drain of Q18 and the drain of Q28. The switch T4 is coupled between the positive (non-inverting) input of G1 and the positive (non-inverting) input of G2. The switch T5 is coupled between the negative (inverting) input of G1 and the negative (inverting) input of G2.

Advantageously, even when the channels 100 and 200 are implemented as interpolation DACs, the techniques of the present disclosure can be applied to achieve various performance enhancements for the first channel 100. For example, the switches T1 and T2 can be closed to short circuit the outputs of the MSB DAC 9110 to the respective outputs of the MSB DAC 9210. The MSBs of D0 can be applied to the MSB DAC 9210 of the second channel 200. Furthermore, the LSBs of D0 can be applied to the LSB decoder LSB2 of the second channel 200. With reference to FIGS. 4, 5, 7 and 8, this can be considered functionally similar to operating the DAC 210 of the second channel 200 in parallel with the DAC 110 of the first channel 100. As such, corresponding advantages can be achieved by closing the switches T1 and T2. In particular, the functionality of the second channel 200 is sacrificed by donating the MSB DAC 9220 of the second channel 200 to the first channel 100, in exchange for performance enhancements to the first channel 100.

Additionally or alternatively, the switches T3 and T4 can be closed. Consequently, the drains of Q28 and Q18 will be short circuited. Furthermore, the positive (non-inverting) inputs of G1 and G2 will be short circuited. With reference to FIGS. 5, 8, 9 and 10, this can be considered functionally similar to operating the first stage 220 of the second channel 200 in parallel with the first stage 120 of the first channel 100. As such, corresponding advantages can be achieved by closing the switches T3 and T4. In particular, the functionality of the second channel 200 is sacrificed by donating components of the interpolation circuit 9220 of the second channel 200 to the first channel 100, in exchange for performance enhancements to the first channel 100.

Additionally or alternatively to the above, the switch T5 may be closed. Consequently, the negative (inverting) inputs of G1 and G2 will be short circuited. The output terminal 9140 of the first channel 100 can be externally short circuited with the output terminal 9240 of the second channel. Alternatively, an extra switch between the output terminals 9140 and 9240 can be closed. With reference to FIGS. 3, 4, 5 and 10, this can be functionally similar to operating the second stage 230 of the second channel 200 in parallel with the second stage 120 of the first channel 100. As such, corresponding advantages can be achieved by closing the switch T5. In particular, the functionality of the second channel 200 is sacrificed by donating components of the output stage 9230 of the second channel 200 to the first channel 100, in exchange for performance enhancements to the first channel 100.

Otherwise, the switches T1-T5 can be left open, and the channels 100 and 200 can operate independently as described in connection with FIG. 2.

It will be appreciated that FIG. 19 represents one possible implementation of the integrated circuit 10 of the present disclosure using interpolation DACs, and other functionally similar or equivalent implementations can be used.

It will be appreciated that whilst only the channels 100 and 200 are shown, the channels 300 and 400 can have a similar architecture and design, with switches in locations corresponding to the locations of the switches T1-T5. Moreover, corresponding switches can be provided in between the channels 200 and 300, so that sub-stages across all four channels can be combined (e.g. as in FIG. 6).

Switches

It will be appreciated that the switches described in the present disclosure may be implemented using any type of electronic or electrical switch, for example using one or more FET devices (e.g. MOSFETs and CMOS switches), logic gates or otherwise. The switches may be made from any of NMOS or PMOS technology, or a combination of both in parallel (transmission gate configuration). In some cases more complex switches such as sequential switches may be used to avoid power supply sequencing problems, for example where separate power supply domains are used. T-switches may also be used to improved isolation between the nodes on either sides of the switch when the switch is "off". FET designs used to implement the switches used can include planar FETs, high-k FETs, HKMG transistors, 2.5D finFETs, and gate-all-around (GAA) FETs. Double-diffused FET devices (DMOS) may also be used and can be advantageous for high voltage applications specifically. Any other variation of FET device can be used. Low off-leakage switches can be implemented using FETs with a relatively high threshold voltage. Moreover, the above described switches and FETs can be used to implement the multiplexers discussed herein.

Moreover, it will be appreciated that a user can interact with the integrated circuit 10 to change the states of the switches in various different ways. In some examples, the integrated circuit 10 includes non-volatile memory (NVM) which controls the states of the switches. Additionally or alternatively, the integrated circuit 10 includes software registers that control the states of the switches. A user can program the NVM or software registers to select the operating states of the switches in accordance with the desired performance mode, e.g. by inputting a control signal to the integrated circuit. In some examples, the NVM or software registers are pre-programmed or "hard coded" with a set of predetermined switch state combinations. Each one of the predetermined switch state combinations may correspond to specific performance modes, such as those described above for FIGS. 2 to 10. As such, a user may not have the freedom to select the state of each individual switch, and may instead select a mode from a set of predefined performance modes. The NVM or software registers may then set the states of the switches in accordance with the selected performance mode, e.g. as shown in FIGS. 2 to 10. The user can communicate with the NVM or software registers to select the desired performance mode by inputting a control signal to the integrated circuit. A control signal can be provided to the integrated circuit via an input terminal of the integrated circuit, via wireless communications means, or via a module of a system on-chip (SoC) or System in a Package (SiP) architecture of the integrated circuit.

Figure 18A:
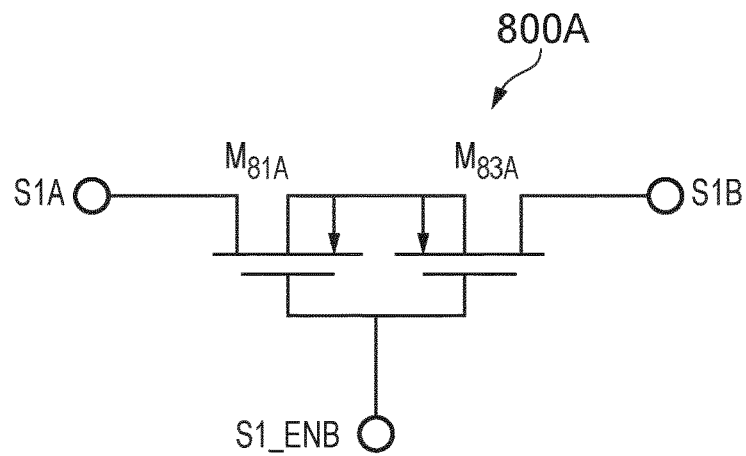
FIGS. 18A-18C show examples of switches that can be used in the integrated circuits of the present disclosure.

FIG. 18A illustrates an example switch 800A which may be used in the examples of the present disclosure. The switch 800A includes PMOS transistors M81A and M83A. The drain of M81A is coupled to a first terminal S1A of the switch 800A. The drain of M83A is coupled to a second terminal S1B of the switch. The sources of M81A and M83A are coupled to each other. The gates of M81A and M83A are coupled to each other. The backgates of M81A and M83A are also coupled together. The gates of M81A and M83A form a control terminal S1_ENB to the switch 800A. For example when a signal at the terminal S1_ENB is "high", the switch 800A may close to form a short circuit between the terminals S1A and S1B. When the signal at the terminal S1_ENB is "low", the switch 800A may open to form an open circuit between the terminals S1A and S1B. Advantageously, there is no forward diode formed between the transistors M81A and M83A, which means that the switch 800A can more effectively and efficiently change states.

Figure 18B:
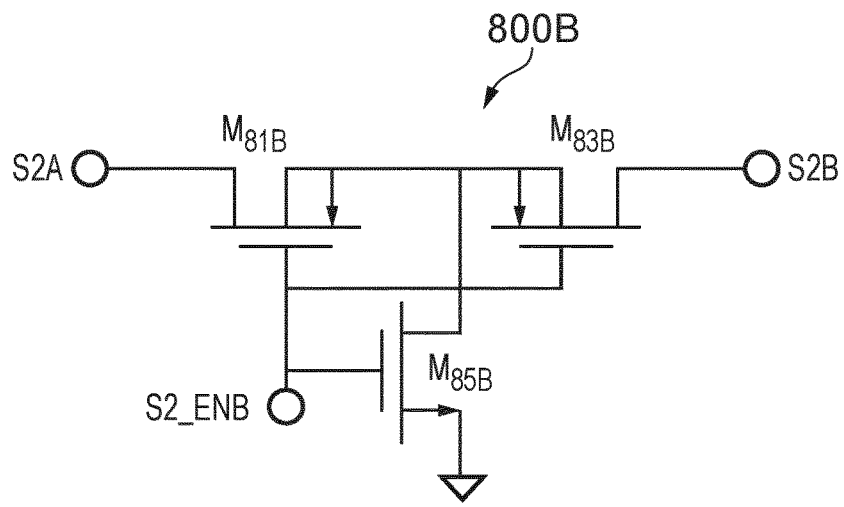

FIG. 18B illustrates another example switch 800B which may be used in the examples of the present disclosure. The switch 800B in FIG. 18B is an example of a T-switch. The switch 800B includes PMOS transistors M81B, M83B and a NMOS transistor M85B. The drain of M81B is coupled to a first terminal S2A of the switch 800B. The drain of M83B is coupled to a second terminal S2B of the switch 800B. The sources of M81B and M83B are coupled to each other. The gates of M81B and M83B are coupled to each other. The drain of M85B is coupled to the sources of M81B and M83B. The gate of M85B is coupled to the gates of M81B and M83B. The source of M85B may be coupled to a reference voltage. The gates of M81B, M83B and M85B form a control terminal S2_ENB to the switch 800A. For example when a signal at the terminal S2_ENB is "high", the switch 800B may close to form a short circuit between the terminals S2A and S2B. When the signal at the terminal S2_ENB is "low", the switch 800B may open to form an open circuit between the terminals S2A and S2B. Advantageously, the T-switch 800B does not have a diode path across it and is therefore robust to power supply sequencing tests and use across different power supply domains. Furthermore, the switch 800B has improved isolation properties. The transistor M85B will tie the node in between the sources of the transistors M81B and M83B to ground when the switch is "off" (open) which gives it a low impedance, thereby improving the isolation between the terminals S2A and S2B in the off state.

Figure 18C:
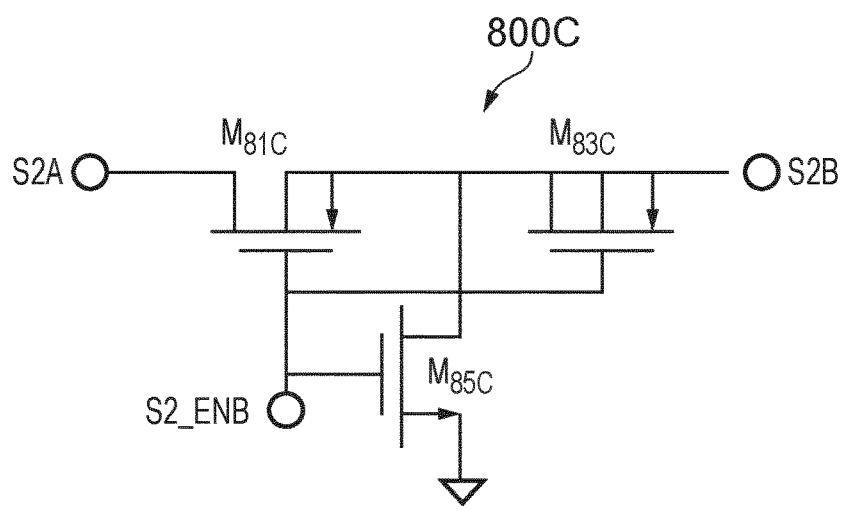

FIG. 18C illustrates another example of a T-switch 800C. The T-switch 800C is similar to the T-switch 800B. However, the transistor M83C is reversed such that its drain is coupled to the source of M81C and its source is coupled to the terminal S2B. As such, the drain of M8C is coupled to the source of M81C and the drain of M83C. The switch 800C may have improved isolation characteristics like the switch 800B, but may not be as robust to switch sequencing techniques.

Although FIGS. 18A-18C show PMOS switch implementations, it will be appreciated that opposite polarity (NMOS) switches may be implemented in a similar way.

It will be appreciated that any other type of switch implementation is within the scope of the present disclosure.

In some examples, the switches can be implemented using fuses, such as one time programmable (OTP) fuses. Any other suitable fuse can be used. The fuses are provided originally in a short circuit state. As such, before the integrated circuit 10 is operated, the states of some fuses are changed to an open circuit state based on user input, in accordance with the desired performance mode. Alternatively, the switches can be implemented using antifuses which are originally provided in an open circuit state. As such, before the integrated circuit 100 is operated, the states of some fuses are changed to a closed circuit state based on user input, in accordance with the desired performance mode. An example of an antifuse is described in U.S. Pat. No. 7,755,162.

Method

Figure 20:
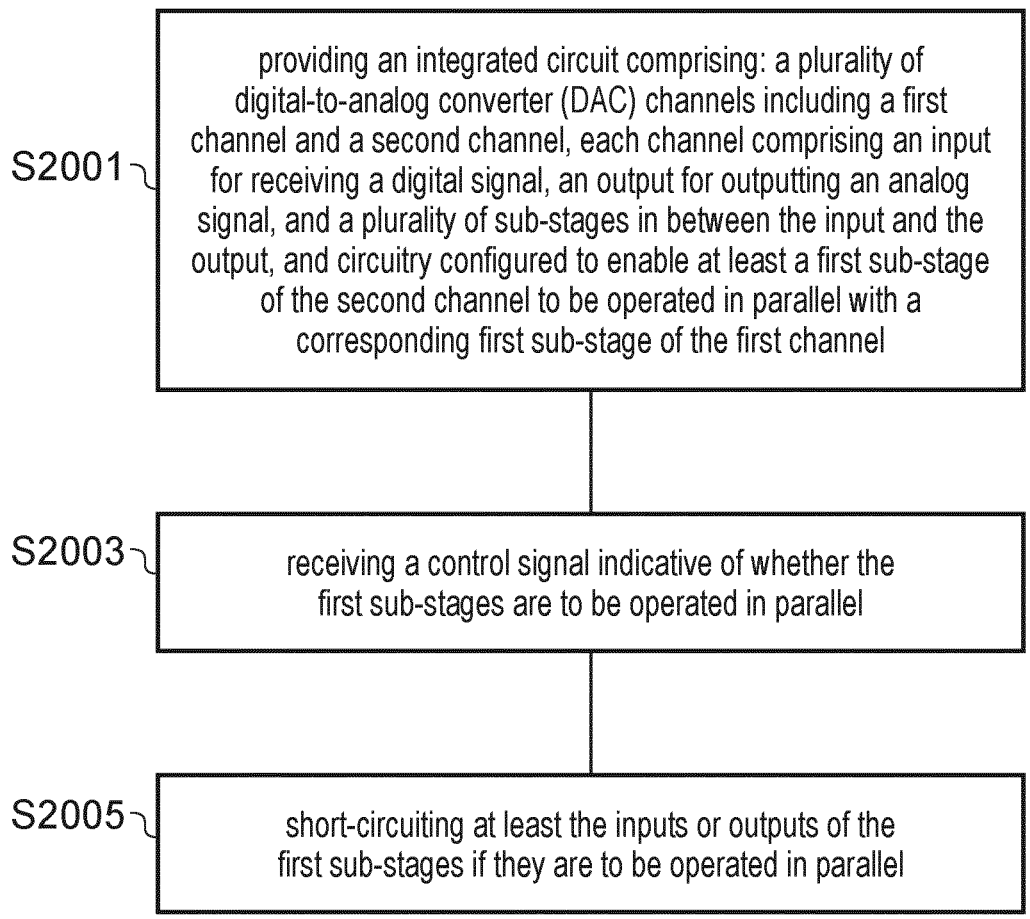
FIG. 20 illustrates a method according to an example of the present disclosure.

FIG. 20 illustrates a method in accordance with an example of the present disclosure. In a step S2001, an integrated circuit is provided which comprises: a plurality of digital-to-analog converter (DAC) channels including a first channel and a second channel, each channel comprising an input for receiving a digital signal, an output for outputting an analog signal, and a plurality of sub-stages in between the input and the output, and circuitry configured to enable at least a first sub-stage of the second channel to be operated in parallel with a corresponding first sub-stage of the first channel.

At step S2003, a control signal indicative of whether the first sub-stages are to be operated in parallel, is received. For example, a user may wish to improve the performance of the first channel by combining the first sub-stage of the second channel with the first sub-stage of the first channel. Moreover, the user may be happy to sacrifice the functionality of the second channel. The user can provide a control signal to the integrated circuit accordingly. The integrated circuit can include circuitry that interprets the control signal and configures the sub-stages accordingly. In some examples, the control signal can be inputted to the integrated circuit via an input terminal of the integrated circuit, via wireless communications means, or via a module of a system on-chip (SoC) or System in a Package (SiP) architecture of the integrated circuit.

At step S2005, it is determined whether the first sub-stages are to be operated in parallel. The inputs or outputs of the first sub-stages are short circuited if they are to be operated in parallel. For example, if the sub-stages being combined are the DAC stages of the channels, it may suffice to short circuit the outputs of the DAC stages to enable the DAC stages to be operated in parallel. A user can then supply the same digital input to both DACs so that the DACs operate in parallel. If the sub-stages being combined are the second amplifier stages of the channels, it may suffice to short circuit the inputs to the second amplifier stages to enable the second amplifier stages to be operated in parallel. A user can then externally short-circuit the output terminals of the integrated circuit to operate the second amplifier stages in parallel. If the sub-stages being combined are the first amplifier stages, both the inputs and the outputs of the stages can be short circuited so that the first stages will operate in parallel.

As discussed above, more than one sub-stage of the second channel can be enabled to operate in parallel with a corresponding sub-stage of the first channel. For example, any combination of the DAC stage, first amplification stage and the second amplification stage of the second channel can be enabled to operate in parallel with the corresponding stages of the first channel. As such, the control signal can indicate whether second sub-stages of the channels are to be operated in parallel, and the method of FIG. 20 can further include short-circuiting at least the inputs or outputs of second sub-stages if they are to be operated in parallel.

Other Variations

Although only four channels are illustrated in the Figures, it will be appreciated that the techniques of the present disclosure can be applied to an integrated circuit with any number of channels. For example, an integrated circuit with N channels can incorporate the techniques of the present disclosure to operate stages of the channels in parallel, as discussed herein, where N is an integer greater than or equal to 2.

In FIGS. 1 to 10, the DACs have been illustrated as providing a single-ended output and the first amplifier stages have been illustrated as having a single-ended input. However it will be appreciated that the DACs may be different DACs that provide a differential output, and the first stages may have a differential input.

The DAC 110, 210, 310, 410 in each channel can be implemented according to any known technique. The DAC can be any voltage DAC. The DAC can otherwise be a current DAC, a C-DAC (capacitive DAC), an active MOS divider and/or include a resistor network.

The outputs of each DAC channel have been described as output "terminals". It will be appreciated that different types of output terminals can be realised for different integrated circuit packages, depending on the technology implemented. For example, the output terminals may be pins, bumps, balls, leadframes, bondwire pads or otherwise. In preferred implementations, the output terminals are for outputting or supplying signals off-chip. In some examples however, the output terminals can be internal on-chip terminals for supplying signals to other on-chip components.

It will be appreciated that switch positions and arrangements different to those described and illustrated herein can be implemented, provided that they allow a user to combine/couple the stages and components of the channels as described above. For example, any switch arrangement can be used provided that it is possible to at least short circuit the outputs of the DACs, the inputs and the outputs of the first stages, and the inputs of second stages as described herein. Moreover, any switch arrangement can be used that allows for at least some high impedance nodes of the first stages to be coupled as described herein. Optionally, the switch arrangement may also allow a user to short circuit the inputs of the DACs and/or the outputs of the second stages. However, it will still be appreciated that the switch arrangement is not required to enable a user to achieve all of the possible stage and component combinations discussed herein. Rather, in some examples, the switch arrangement can allow for any one or more of the circuit configurations shown in FIGS. 3 to 10 and described above, in addition to the circuit configuration in FIG. 2. Even though some of the illustrated circuit configurations may not be achievable in such examples, the integrated circuit 10 can still provide flexibility whilst reducing the amount of redundant circuitry on chip by allowing a user to combine at least one stage of a channel with another channel.

In some examples, switches are not required at the output of the DACs 110-410 in order to operate them in parallel. Rather, switches may be provided between nodes internal to the DACs 110-410, which can be closed to achieve the desired parallel operation of the DACs.

In some examples, each DAC channel 100-400 can include one or more additional stages in between the first amplifier stage and the second amplifier stage. The additional stages can provide additional gain to the channel, which can be useful in implementations with particularly low intrinsic voltage gains (e.g. when using nanometer CMOS technology). The additional stages can be included for any other appropriate enhancements to the channels. Any known additional stages can be used. It will be appreciated that the presence of additional stages between the first and second amplifier stages will not affect the ability to combine the various components and stages of the channels as discussed herein. Moreover, the additional stages can be configured to allow for parallel operation between the additional stages of different channels, in accordance with the techniques of this disclosure. For example the inputs, outputs and/or high impedance nodes in the additional stages of a channel can be coupled via switches to corresponding locations in another channel.

It will be appreciated that any known technique can be used to power down unused stages or channels to improve power efficiency of the integrated circuit 10. For example channels or stages may be powered off using circuit switching techniques or power supply regulation techniques.

It will be appreciated that various biasing techniques can be used to implement FET devices discussed herein, including e.g. bulk biasing techniques such as backward, forward or adaptive bulking biasing (BBB, FBB and ABB respectfully). Advantageously, such biasing techniques can be useful for achieving a wider input voltage range of the FET devices, reducing off-state leakage in switches, and varying the threshold voltage if or as required. Backward or adaptive bulk biasing techniques may be particularly useful for providing low off-leakage switches.

It will be appreciated that known best practice techniques can be used to minimise the effects of parasitic impedances and layout dependent effects (LDEs) resulting from the switch arrangements and circuit configurations discussed herein. For example, implementations can be verified using simulations. Similarly, best practice techniques may be used to make the implementation robust to other integrated circuit manufacturing, packaging and thermal considerations. Moreover, it will be appreciated that each channel may be designed and implemented using best practice design and layout techniques so that the power and current delivery characteristics of each channel are substantially the same.

The current sources described herein can be any suitable type of current source, including but not limited to simple (e.g. single device) MOS current sources, cascaded MOS current sources, or any other suitable type of current source.

Further Examples

The following examples show features of the present disclosure which may be taken in combination.

Example 1. An integrated circuit comprising:
a plurality of digital-to-analog converter (DAC) channels including a first channel and a second channel, each channel comprising an input for receiving a digital signal, an output for outputting an analog signal, and a plurality of sub-stages in between the input and the output; and
one or more circuit elements that are changeable between a short circuit state and an open circuit state,
wherein an input node or an output node of at least a first sub-stage of the second channel is coupled to a signal path of the first channel, via at least one of the circuit elements.

Example 2. The integrated circuit of Example 1, wherein the input node or the output node of the first sub-stage of the second channel is coupled to a corresponding input node or output node of a first sub-stage of the first channel.

Example 3. The integrated circuit of Examples 1 or 2, wherein the first sub-stage of the first channel includes a signal path of the first channel, and the first sub-stage of the second channel includes a signal path of the second channel.

Example 4. The integrated circuit of any of Examples 1 to 3, wherein the integrated circuit is configured to receive a control signal, and the circuitry is configured to select a state pf the circuit elements based on the control signal.

Example 5. The integrated circuit of any of Examples 1 to 4, wherein the at least one circuit element is coupled between an input node of the first sub-stage of the second channel and a corresponding input node of the first sub-stage of the first channel.

Example 6. The integrated circuit of any of Examples 1 to 4, wherein the at least one circuit element is coupled between an output node of the first sub-stage of the second channel and a corresponding output node of the first sub-stage of the first channel.

Example 7. The integrated circuit of any of Examples 1 to 4, wherein the plurality of circuit elements includes a first circuit element coupled between an input node of the first sub-stage of the second channel and a corresponding input node of the first sub-stage of the first channel, and at least one circuit element coupled between an output node of the first sub-stage of the second channel and a corresponding output node of the first sub-stage of the first channel.

Example 8. The integrated circuit of any of Examples 1 to 7, wherein at least one internal node of the first sub-stage of the second channel is coupled to a corresponding internal node of the first sub-stage of the first channel via at least one of the circuit elements.

Example 9. The integrated circuit of any of Examples 1 to 8, wherein the integrated circuit is configured to power down at least one other sub-stage of the second channel when the circuitry enables the first sub-stages to be coupled in parallel.

Example 10. The integrated circuit of Example 9, wherein powering down the at least one other sub-stage of the second channel comprises causing an output of said sub-stage to float.

Example 11. The integrated circuit of Example 10, further comprising pull-up and/or pull-down circuitry arranged to cause the output of said sub-stage to float.

Example 12. The integrated circuit of any of Examples 1 to 11, wherein an input node or an output node of a second sub-stage of the second channel is coupled to a signal path of the first channel, via at least one of the circuit elements.

Example 13. The integrated circuit of any of Examples 1 to 12, wherein each plurality of sub-stages includes a DAC stage, a first amplification stage and a second amplification stage, the first amplification stage being arranged between the DAC stage and the second amplification stage,
  wherein the outputs of the DACs are coupled via at least one of the circuit elements;
  wherein the inputs of the first amplification stages are coupled via at least one circuit element, and the outputs of the first amplification stages are coupled via at least one of the circuit elements; and
  wherein inputs of the second amplification stages are coupled via at least one of the circuit elements.

Example 14. The integrated circuit of any of Examples 1 to 12, wherein each DAC channel is an interpolation DAC.

Example 15. The integrated circuit of any of Examples 1 to 14, wherein the plurality of channels further comprises a third channel, wherein an input node or an output node of a first sub-stage of the third channel is coupled to the signal path of the first channel, via at least one of the circuit elements, the first sub-stage of the third channel corresponding to the first sub-stage of the second channel.

Example 16. The integrated circuit of any of Examples 1 to 15, wherein the sub-stages of each channel have substantially the same architecture.

According to another example of the present disclosure, there is provided an integrated circuit comprising:
  a first channel and a second channel, each channel having
    a plurality of stages including:
      a digital-to-analog converter (DAC) for receiving a respective digital input,
      a first amplification stage having an input coupled to an output of the DAC,
      a second amplification stage having an input coupled to an output of the
      first amplification stage, and
      an output terminal coupled to an output of the second stage;
    wherein the input or the output of at least one stage of the second channel is coupled to a signal path of the first channel via at least one circuit element, said at least one circuit element being changeable between a short circuit state and an open circuit state.

In some examples, the integrated circuit comprises a plurality of circuit elements that are changeable between a short circuit state and an open circuit state.

In some examples, the plurality of circuit elements are arranged such that the inputs to the second amplifiers are coupled via at least one of the circuit elements.

In some examples, the circuit elements are arranged such that the inputs to the first amplifiers are coupled via at least one of the circuit elements.

In some examples, the circuit elements are arranged such that the outputs of each DAC are coupled via at least one of the circuit elements.

In some examples, high impedance nodes internal to the first amplifier of the first channel are coupled to respective high impedance nodes internal the first amplifier of the second channel via at least some of the circuit elements.

In some examples, the integrated circuit comprises circuitry that is configured to power down the DAC and/or the first amplifier of the second channel.

In some examples, the circuitry that is configured to power down the first amplifier of the second channel comprises one or more of pull-up circuitry and pull-down circuitry.

In some examples, the first stages comprise an op-amp and have substantially the same architecture.

In some examples, each of the second stages are one of: a class A amplifier, a class B amplifier, or a class AB amplifier.

In some examples, the circuit elements are switches or fuses.

In some examples, the integrated circuit further comprises a third channel and a fourth channel, each of the third and the fourth channels also comprising a DAC, a first amplifier, a second amplifier and an output bump or pin.

In some examples, the plurality of circuit elements are arranged such that the input to each second amplifier is coupled to the input to each other second amplifier via at least some of the circuit elements.

In some examples, the plurality of circuit elements are arranged such that the input to each first amplifier is coupled to the input to each other second amplifier via at least some of the circuit elements.

In some examples, the plurality of circuit elements are arranged such that the output of each DAC is coupled to the output of each other DAC via at least some of the circuit elements.

In some examples, the integrated circuit comprises a user input means for controlling or changing the states of the plurality of circuit elements.

The invention claimed is:

1. An integrated circuit comprising:
   a plurality of digital-to-analog converter (DAC) channels including a first channel and a second channel, each channel comprising an input for receiving a digital signal, an output for outputting an analog signal, and a plurality of sub-stages in between the input and the output; and
   circuitry configured to enable at least a first sub-stage of the second channel to be operated in parallel with a corresponding first sub-stage of the first channel.

2. The integrated circuit of claim 1, wherein the first sub-stage of the first channel includes a signal path of the first channel, and the first sub-stage of the second channel includes a signal path of the second channel.

3. The integrated circuit of claim 1, wherein the integrated circuit is configured to receive a control signal, and the circuitry is configured to enable the first sub-stages to be operated in parallel based on the control signal.

4. The integrated circuit of claim 1, wherein the circuitry includes a plurality of circuit elements that are changeable between a short circuit state and an open circuit state.

5. The integrated circuit of claim 4, wherein the plurality of circuit elements includes at least one circuit element coupled between an input node of the first sub-stage of the second channel and a corresponding input node of the first sub-stage of the first channel,
   wherein the circuitry enables the first sub-stages to be operated in parallel when the circuit element is in a short circuit state.

6. The integrated circuit of claim 4, wherein the plurality of circuit elements includes at least one circuit element coupled between an output node of the first sub-stage of the second channel and a corresponding output node of the first sub-stage of the first channel,
   wherein the circuitry enables the first sub-stages to be operated in parallel when the circuit element is in a short circuit state.

7. The integrated circuit of claim 4, wherein the plurality of circuit elements includes a first circuit element coupled between an input node of the first sub-stage of the second channel and a corresponding input node of the first sub-stage of the first channel, and at least one circuit element coupled between an output node of the first sub-stage of the second channel and a corresponding output node of the first sub-stage of the first channel,
   wherein the circuitry enables the first sub-stages to be operated in parallel when the first and the second circuit elements are in a short circuit state.

8. The integrated circuit of claim 4, wherein at least one internal node of the first sub-stage of the second channel is coupled to a corresponding internal node of the first sub-stage of the first channel via at least one of the circuit elements.

9. The integrated circuit of claim 1, wherein the integrated circuit is configured to power down at least one other sub-stage of the second channel when the circuitry enables the first sub-stages to be coupled in parallel.

10. The integrated circuit of claim 9, wherein powering down the at least one other sub-stage of the second channel comprises causing an output of said sub-stage to float.

11. The integrated circuit of claim 10, further comprising pull-up and/or pull-down circuitry arranged to cause the output of said sub-stage to float.

12. The integrated circuit of claim 1, wherein the circuitry is further configured to enable a second sub-stage of the second channel to be operated in parallel with a corresponding second sub-stage of the first channel.

13. The integrated circuit of claim 1, wherein each plurality of sub-stages includes a DAC stage, a first amplification stage and a second amplification stage, the first amplification stage being arranged between the DAC stage and the second amplification stage,
   wherein any one or more of the following applies:
      the circuitry is configured to enable the DAC stage of the second channel to be operated in parallel with the DAC stage of the first channel,
      the circuitry is configured to enable the first amplification stage of the second channel to be operated in parallel with the first amplification stage of the first channel,
      the circuitry is configured to enable the second amplification stage of the second channel to be operated in parallel with the second amplification stage of the first channel.

14. The integrated circuit of claim 13, wherein any one or more of the following applies:
   wherein the outputs of the DACs are coupled via at least one circuit element that is changeable between a short circuit state and an open circuit state;
   wherein the inputs of the first amplification stages are coupled via at least one circuit element that is changeable between a short circuit state and an open circuit state, and the outputs of the first amplification stages are coupled via at least one circuit element that is changeable between a short circuit state and an open circuit state; and
   wherein inputs of the second amplification stages are coupled via at least one circuit element that is changeable between a short circuit state and an open circuit state.

15. The integrated circuit of claim 1, wherein each DAC channel is an interpolation DAC.

16. The integrated circuit of claim 1, wherein the plurality of channels further comprises a third channel, wherein the circuitry is configured to enable the first sub-stage of the first channel and the first sub-stage of the second channel to be operated in parallel with a first sub-stage of the third channel.

17. The integrated circuit of claim 1, wherein the first sub-stages have substantially the same architecture.

18. A method comprising:
   providing an integrated circuit comprising: a plurality of digital-to-analog converter (DAC) channels including a first channel and a second channel, each channel comprising an input for receiving a digital signal, an output for outputting an analog signal, and a plurality of sub-stages in between the input and the output, and circuitry configured to enable at least a first sub-stage of the second channel to be operated in parallel with a corresponding first sub-stage of the first channel;
   receiving a control signal indicative of whether the first sub-stages are to be operated in parallel; and
   short-circuiting inputs or outputs of the first sub-stages if they are to be operated in parallel.

19. The method of claim 18, wherein the circuitry is further configured to enable a second sub-stage of the second channel to be operated in parallel with a corresponding second sub-stage of the second channel,
   wherein the control signal is indicative of whether the second sub-stages are to be operated in parallel, the method further comprising short-circuiting inputs or outputs of the second sub-stages if they are to be operated in parallel.

20. An integrated circuit comprising:
a plurality of a digital-to-analog converters (DAC) including a first DAC and a second DAC, each DAC configured to convert a digital input into an analog signal, and each DAC including a plurality of sub-stages; and
circuitry configured to enable at least a first sub-stage of the second DAC to be operated in parallel with a corresponding first sub-stage of the first DAC.

* * * * *